(12) United States Patent
Lin et al.

(10) Patent No.: US 12,119,276 B2
(45) Date of Patent: *Oct. 15, 2024

(54) PACKAGE STRUCTURE WITH PROTECTIVE LID

(71) Applicant: TAIWAN SEMICONDUCTOR MANUFACTURING COMPANY, LTD., Hsinchu (TW)

(72) Inventors: Wen-Yi Lin, New Taipei (TW); Kuang-Chun Lee, New Taipei (TW); Chien-Chen Li, Hsinchu (TW); Chen-Shien Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/360,465

(22) Filed: Jul. 27, 2023

(65) Prior Publication Data

US 2023/0369149 A1 Nov. 16, 2023

Related U.S. Application Data

(63) Continuation of application No. 17/244,686, filed on Apr. 29, 2021, now Pat. No. 11,764,118.

(51) Int. Cl.
*H01L 23/10* (2006.01)
*H01L 21/48* (2006.01)
(Continued)

(52) U.S. Cl.
CPC .......... *H01L 23/10* (2013.01); *H01L 21/4817* (2013.01); *H01L 23/053* (2013.01);
(Continued)

(58) Field of Classification Search
CPC ... H01L 23/10; H01L 21/4817; H01L 23/053; H01L 23/3675; H01L 23/552; H01L 23/562; H01L 24/06; H01L 2924/16195; H01L 25/0655; H01L 23/49816; H01L 23/5385; H01L 2224/16225; H01L 2224/32225; H01L 2924/15311;
(Continued)

(56) References Cited

U.S. PATENT DOCUMENTS 6,967,403 B2   11/2005   Chuang et al.
8,946,886 B1 *  2/2015   Fuentes ................... H01L 23/36
                                                              257/710

(Continued)

*Primary Examiner* — Patricia D Valenzuela
(74) *Attorney, Agent, or Firm* — Birch, Stewart, Kolasch & Birch, LLP

(57) ABSTRACT

A package structure is provided. The package structure includes a substrate and a chip-containing structure over the substrate. The package structure also includes a protective lid attached to the substrate through a first adhesive element and a second adhesive element. The first adhesive element has a first electrical resistivity, and the second adhesive element has a second electrical resistivity. The second electrical resistivity is greater than the first electrical resistivity. The second adhesive element is closer to a corner edge of the substrate than the first adhesive element, and a portion of the second adhesive element is between the first adhesive element and the chip-containing structure.

20 Claims, 20 Drawing Sheets

(51) Int. Cl.
  *H01L 23/00* (2006.01)
  *H01L 23/053* (2006.01)
  *H01L 23/367* (2006.01)
  *H01L 23/552* (2006.01)

(52) U.S. Cl.
  CPC ........ *H01L 23/3675* (2013.01); *H01L 23/552* (2013.01); *H01L 23/562* (2013.01); *H01L 24/06* (2013.01); *H01L 2924/10329* (2013.01); *H01L 2924/1033* (2013.01); *H01L 2924/16195* (2013.01)

(58) Field of Classification Search
  CPC ..... H01L 2924/181; H01L 2924/18161; H01L 25/072; H01L 21/56; H01L 21/568; H01L 23/3128; H01L 21/76224; H01L 21/02164; H01L 21/02222; H01L 21/02271; H01L 21/02274; H01L 21/02318; H01L 21/02321; H01L 21/02326; H01L 21/02337; H01L 21/31155; H01L 21/76237; H01L 27/0924; H01L 27/1211; H01L 29/0649; H01L 29/36; H01L 29/66795; H01L 29/7851; H01L 21/02296; H01L 21/2255; H01L 21/26513; H01L 21/823431; H01L 27/0886; H01L 29/0847; H01L 29/1054; H01L 29/66803; H01L 21/0214; H01L 21/02219; H01L 21/02323; H01L 29/66545; H01L 21/324; H01L 21/823821; H01L 21/823493; H01L 29/785; H01L 29/7856; H01L 2924/1033; H01L 2924/10329
  See application file for complete search history.

(56) References Cited

U.S. PATENT DOCUMENTS

| | | | |
|---|---|---|---|
| 8,993,380 | B2 | 3/2015 | Hou et al. |
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,299,649 | B2 | 3/2016 | Chiu et al. |
| 9,368,460 | B2 | 6/2016 | Yu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 11,764,118 | B2 * | 9/2023 | Lin ............... H01L 23/562 257/659 |
| 2013/0119529 | A1 | 5/2013 | Lin et al. |
| 2017/0263515 | A1 * | 9/2017 | Bolognia ........... H01L 23/053 |
| 2020/0098655 | A1 | 3/2020 | Nair et al. |
| 2021/0193538 | A1 | 6/2021 | Huang et al. |

* cited by examiner

PACKAGE STRUCTURE WITH PROTECTIVE LID

This application is a Continuation of U.S. application Ser. No. 17/244,686, filed on Apr. 29, 2021, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
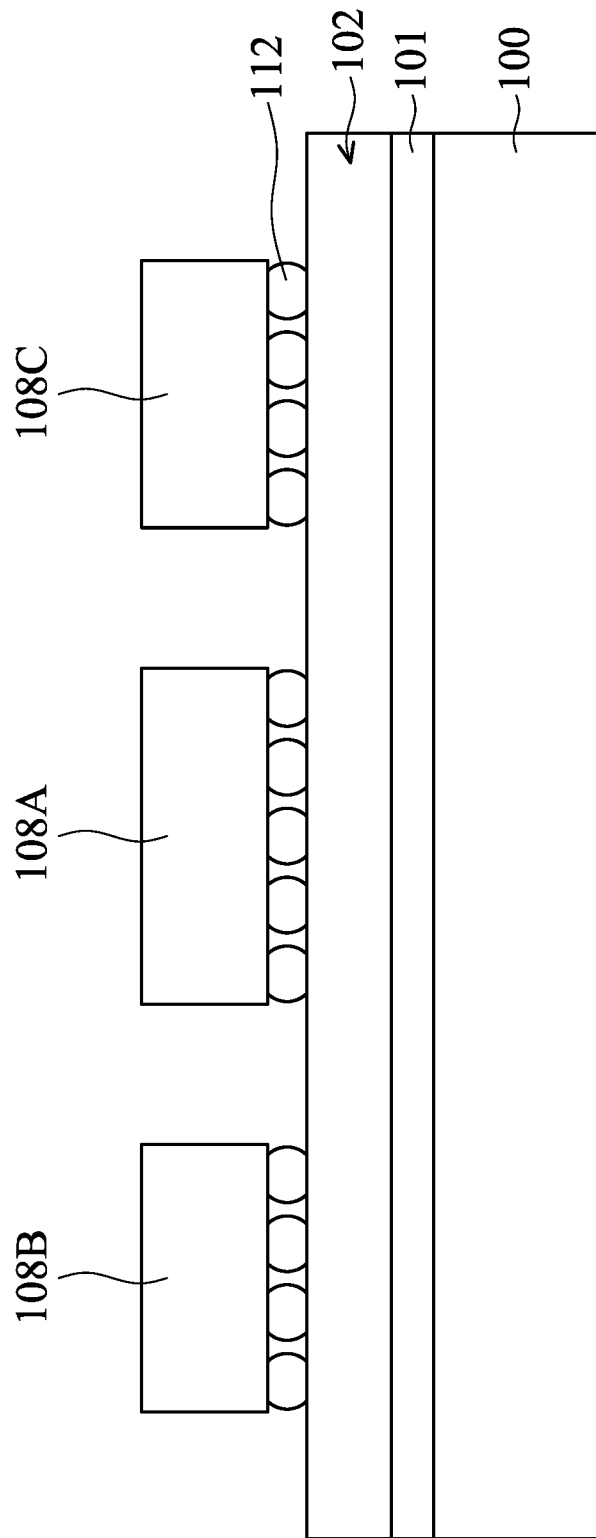
FIGS. 1A-1D are cross-sectional views of various stages of a process for forming a portion of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to package structures such as three-dimensional (3D) packaging or 3D-IC devices. Embodiments of the disclosure form a package structure including a substrate that carries one or more dies or packages and a protective lid aside the dies or packages. The protective lid may also function as a warpage-control element and/or heat dissipation element. In some embodiments, the protective lid is attached to the substrate through one or more adhesive elements. One or some of the adhesive elements is/are electrically conductive. The conductive adhesive element may form electrical connection between the protective lid and a ground structure. As a result, the protective lid may also be used to reduce or prevent electromagnetic interference (EMI) to and/or from the one or more dies or packages below the protective lid. Another adhesive element that may be electrically non-conductive may help to reduce the risk of cracking of the package structure. Due to the hybrid adhesive elements, the EMI problems and the package reliability issues may be reduced or prevented at the same time. The performance and quality of the package structure are greatly improved.

FIGS. 1A-1D are cross-sectional views of various stages of a process for forming a portion of a package structure, in accordance with some embodiments. As shown in FIG. 1A, a carrier substrate 100 is provided or received. The carrier substrate 100 is used as a support substrate during the fabrication process. In some embodiments, the carrier substrate 100 is a temporary support carrier and will be removed later.

The carrier substrate 100 may be made of or include a dielectric material, a semiconductor material, one or more other suitable materials, or a combination thereof. In some embodiments, the carrier substrate 100 is a dielectric substrate, such as a glass wafer. In some other embodiments, the carrier substrate 100 is a semiconductor substrate, such as a silicon wafer. The semiconductor substrate may be made of or include silicon, germanium, silicon germanium, one or more other suitable semiconductor materials, or a combination thereof.

As shown in FIG. 1A, a redistribution structure 102 is formed over the carrier substrate 100, in accordance with some embodiments. The redistribution structure 102 may include a release film 101, multiple insulating layers, and multiple conductive features. The release film 101 and the carrier substrate 100 may together be removed later.

In some embodiments, the insulating layers in the redistribution structure 102 are polymer-containing layers. The insulating layers may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers. These openings may be used to contain some of the conductive features.

The conductive features in the redistribution structure 102 may include conductive lines, conductive vias, and/or conductive pads. The conductive features may be made of or include copper, cobalt, tin, titanium, gold, platinum, aluminum, tungsten, one or more other suitable materials, or a combination thereof. The conductive features may be formed using an electroplating process, an electroless plating process, one or more other applicable processes, or a combination thereof. The formation of the conductive features may further involve one or more etching processes.

As mentioned above, some of the conductive features in the redistribution structure 102 are conductive vias. In some embodiments, the upper portion of the conductive via is wider than the lower portion of the conductive via.

As shown in FIG. 1A, multiple chip structures (or chip-containing structures) 108A, 108B, and 108C are disposed over the redistribution structure 102, in accordance with some embodiments. In some embodiments, before the chip structures 108A, 108B, and 108C are disposed, a testing operation is performed to the conductive paths of the redistribution structure 102 to ensure the quality and reliability of the redistribution structure 102. In some embodiments, the chip structures 108A, 108B, and 108C may be chip packages.

In some embodiments, the chip structures 108A, 108B, and 108C are bonded onto the conductive pads of the redistribution structure 102 through conductive connectors 112. In some embodiments, each of the chip structures 108A, 108B, and 108C includes conductive pillars (or conductive pads) with solder elements formed thereon. Other solder elements may also be formed on the conductive pads of the redistribution structure 102. The chip structures 108A, 108B, and 108C are picked up and placed onto the redistribution structure 102. In some embodiments, the solder elements of the chip structures 108A, 108B, and 108C and/or the solder elements on the conductive pads of the redistribution structure 102 are reflowed together. As a result, the reflowed solder elements form the conductive connectors 112.

In some embodiments, the conductive connectors 112 are made of tin-containing solder materials. The tin-containing solder materials may further include copper, silver, gold, aluminum, lead, one or more other suitable materials, or a combination thereof. In some other embodiments, the conductive connectors 112 are lead-free.

Each of the chip structures 108A, 108B, and 108C may be a single semiconductor die, system-on-integrated-chips (SoIC), and/or a package including one or more semiconductor dies that are encapsulated or protected. For the system-on-integrated-chips, multiple semiconductor dies may be stacked and bonded together to form electrical connections between these semiconductor dies. These semiconductor dies may be bonded to each other through hybrid bonding that may include dielectric-to-dielectric bonding and metal-to-metal bonding.

In some embodiments, the semiconductor die(s) in each of the chip structures 108A, 108B, and 108C is a system-on-chip (SoC) chip that includes multiple functions. In some embodiments, the back sides of the semiconductor dies face upwards with the front sides of the semiconductor dies facing the redistribution structure 102. In some embodiments, some of the semiconductor dies include memory devices such as high bandwidth memory (HBM) devices.

In some other embodiments, the chip structures 108A, 108B, and 108C are packages that include one or more semiconductor dies therein. In some other embodiments, the chip structure 108A is an SoIC die, and the chip structures 108B and 108C include memory devices.

In some embodiments, two or more of the chip structures 108A-108C have different functions. In some embodiments, one or some of the chip structures 108A-108C include(s) high-frequency integrated circuits, Serializer and/or Deserializer (Serdes) circuits, low-noise amplifier (LNA) modules, low-loss filter modules, power amplifier (PA) modules, baseband modules, power management integrated circuit (PMIC), memory modules, micro-electromechanical system (MEMS) modules, nano-electromechanical systems (NEMS) modules, one or more other suitable circuits, or a combination thereof. During the operation of the chip structures 108A, 108B, and/or 108C, high-speed signals from the semiconductor dies and/or the conductive traces in the chip structures 108A, 108B, and/or 108C might cause electromagnetic interference to other nearby devices in some cases.

Figure 1B:
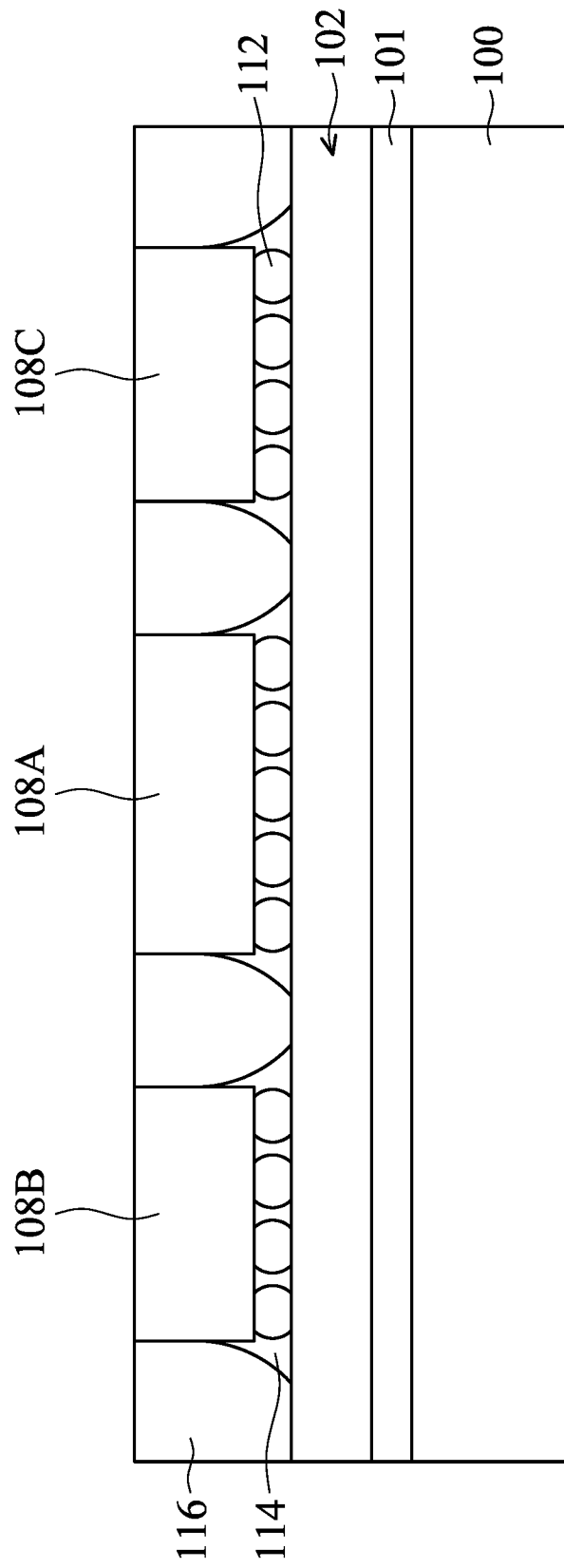

As shown in FIG. 1B, an underfill structure 114 is formed to surround and protect the conductive connectors 112, in accordance with some embodiments. The underfill structure 114 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

Afterwards, a protective layer 116 is formed over the redistribution structure 102 to surround and protect the chip structures 108A, 108B, and 108C, as shown in FIG. 1B in accordance with some embodiments. In some embodiments, the protective layer 116 is in direct contact with the redistribution structure 102. In some embodiments, the protective layer 116 is separated from the conductive connectors 112 below the chip structures 108A, 108B, and 108C by the underfill structure 114.

However, embodiments of the disclosure are not limited thereto. Many variations and/or modifications can be made to embodiments of the disclosure. In some other embodiments, the underfill structure 114 is not formed. In these cases, the protective layer 116 may be in direct contact with the conductive connectors 112 below the chip structures 108A, 108B, and 108C.

In some embodiments, the protective layer 116 is made of or includes an insulating material such as a molding material. The molding material may include a polymer material, such as an epoxy-based resin with fillers dispersed therein. The fillers may include fibers (such as silica fibers and/or carbon-containing fibers), particles (such as silica particles and/or carbon-containing particles), or a combination thereof. In some embodiments, the distribution density of the fillers in the protective layer 116 is greater than the distribution density of the fillers in the underfill structure 114. In some embodiments, the weight percentage of the fillers in the protective layer 116 is greater than the weight percentage of the fillers in the underfill structure 114. The profiles, sizes, and/or materials of the fillers in the protective layer 116 and the underfill structure 114 may be different from each other.

In some embodiments, a molding material (such as a flowable molding material) is introduced or injected to cover the redistribution structure 102 and the chip structures 108A, 108B, and 108C. In some embodiments, a thermal process is then used to cure the flowable molding material and to transform it into the protective layer 116. In some embodiments, a planarization process is performed to the protective layer 116 to improve the flatness of the protective layer 116. For example, the planarization process may include a grinding process, a CMP process, a dry polishing process, one or more other applicable processes, or a combination thereof. In some embodiments, after the planarization process, the surfaces of the chip structures 108A, 108B, and 108C are exposed. In some embodiments, the top surface of the protective layer 116 is substantially level with the surfaces of the chip structures 108A, 108B, and 108C.

Figure 1C:
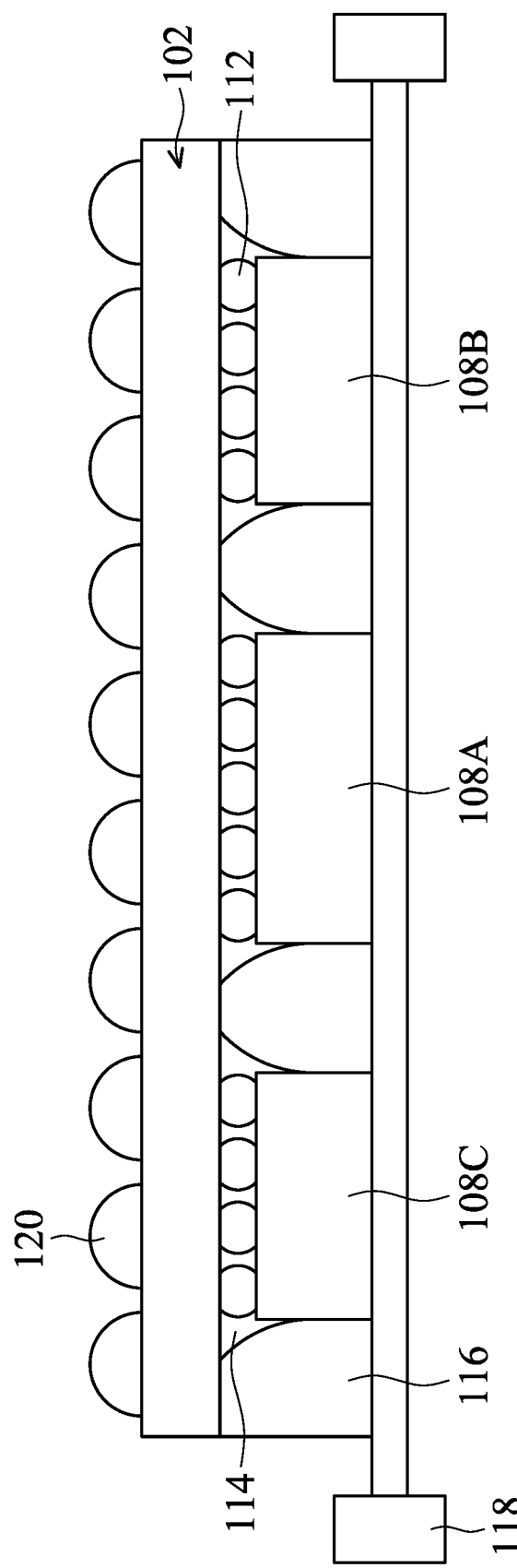

Afterwards, the structure shown in FIG. 1B is flipped upside down and attached onto a carrier tape 118, in accordance with some embodiments. Afterwards, the carrier substrate 100 and the release film 101 are removed, as shown in FIG. 1C in accordance with some embodiments. As a result, the surface of the redistribution structure 102 that is originally covered by the carrier substrate 100 is exposed.

Afterwards, conductive connectors (or bonding structures) 120 are formed over the redistribution structure 102, as shown in FIG. 1C in accordance with some embodiments. In some embodiments, the material of the conductive connectors 120 are the same as or similar to those of the conductive connectors 112. The formation of the conductive connectors 120 may involve applying solder materials and one or more thermal reflow operations. In some embodiments, each of the conductive connectors 120 is larger than each of the conductive connectors 112, as shown in FIG. 1C.

Figure 1D:
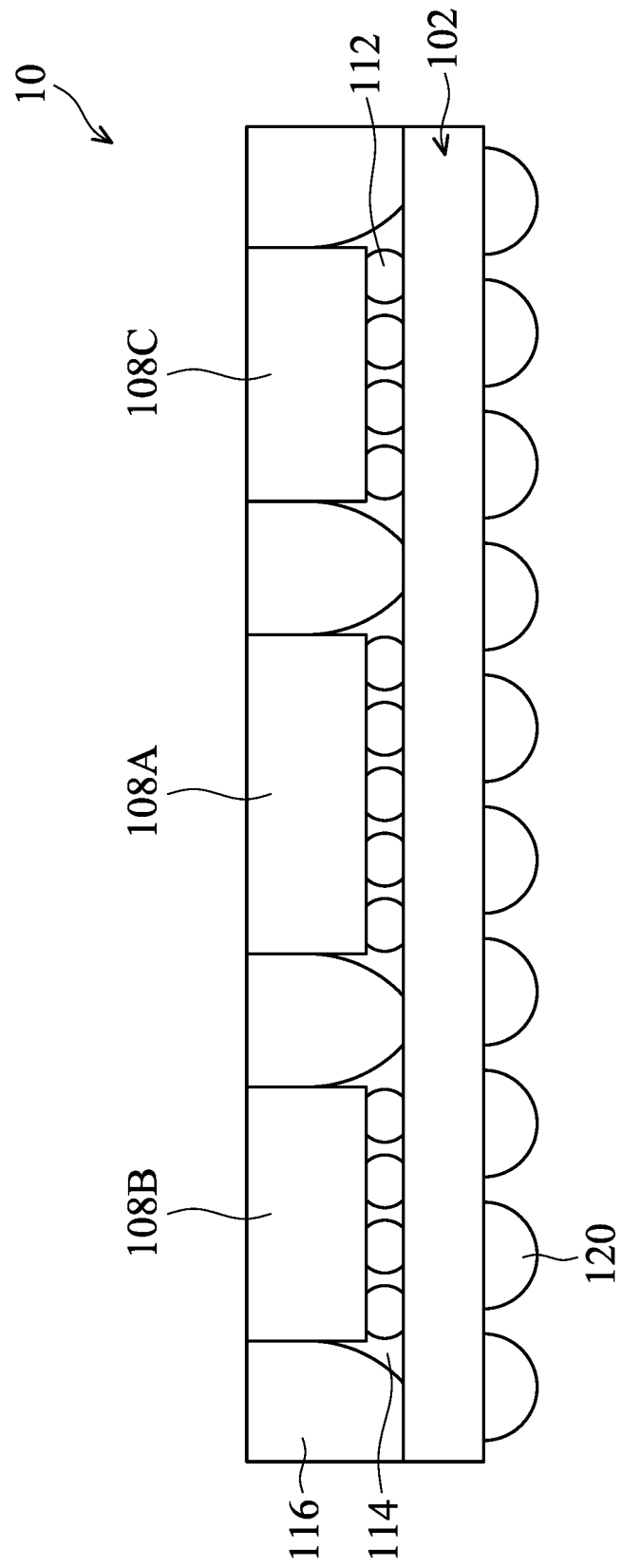

In some embodiments, a sawing process is used to cut through the structure shown in FIG. 1C into multiple separate die packages. After the sawing process, one die package (or a chip-containing structure) 10 is picked from the carrier tape 118 and turned upside down, as shown in FIG. 1D in accordance with some embodiments. The die package 10 is to be integrated with other elements to form a larger package structure. The die package 10 that includes the chip structures 108A-108C may also be referred to as a "chip structure" or a "chip-containing structure".

However, embodiments of the disclosure are not limited thereto. Many variations and/or modifications can be made to embodiments of the disclosure. In some other embodiments, the sawing process is not performed to separate the structure in FIG. 1C into multiple smaller die packages. The entirety of the package structure may directly be integrated into a large package structure without being sawed.

FIGS. 2A-2D are cross-sectional views of various stages of a process for forming a portion of a package structure, in accordance with some embodiments. FIGS. 3A-3D are plan views of various stages of a process for forming a portion of a package structure, in accordance with some embodiments.

Figure 2A:
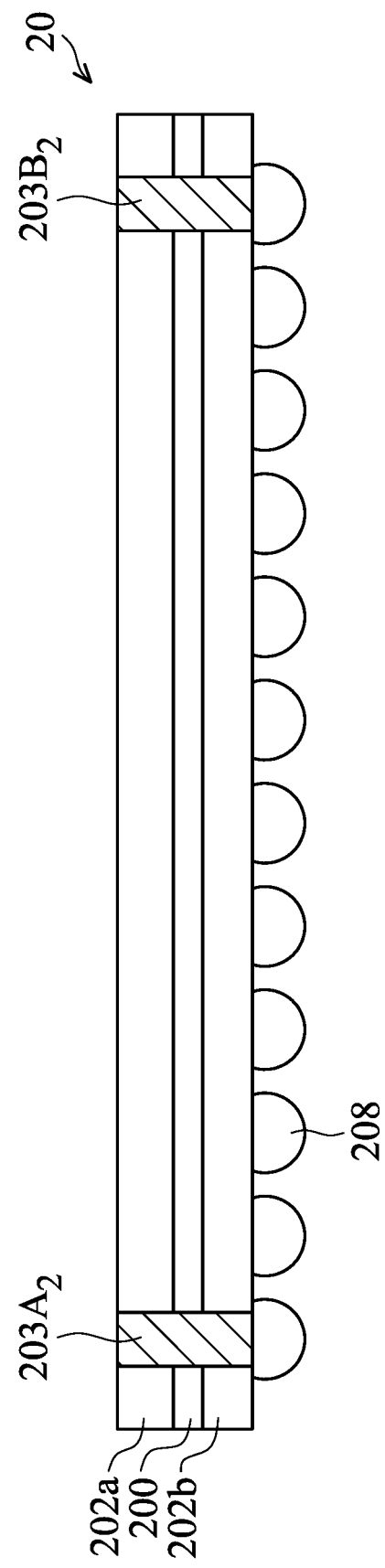
FIGS. 2A-2D are cross-sectional views of various stages of a process for forming a portion of a package structure, in accordance with some embodiments.
Figure 2B:
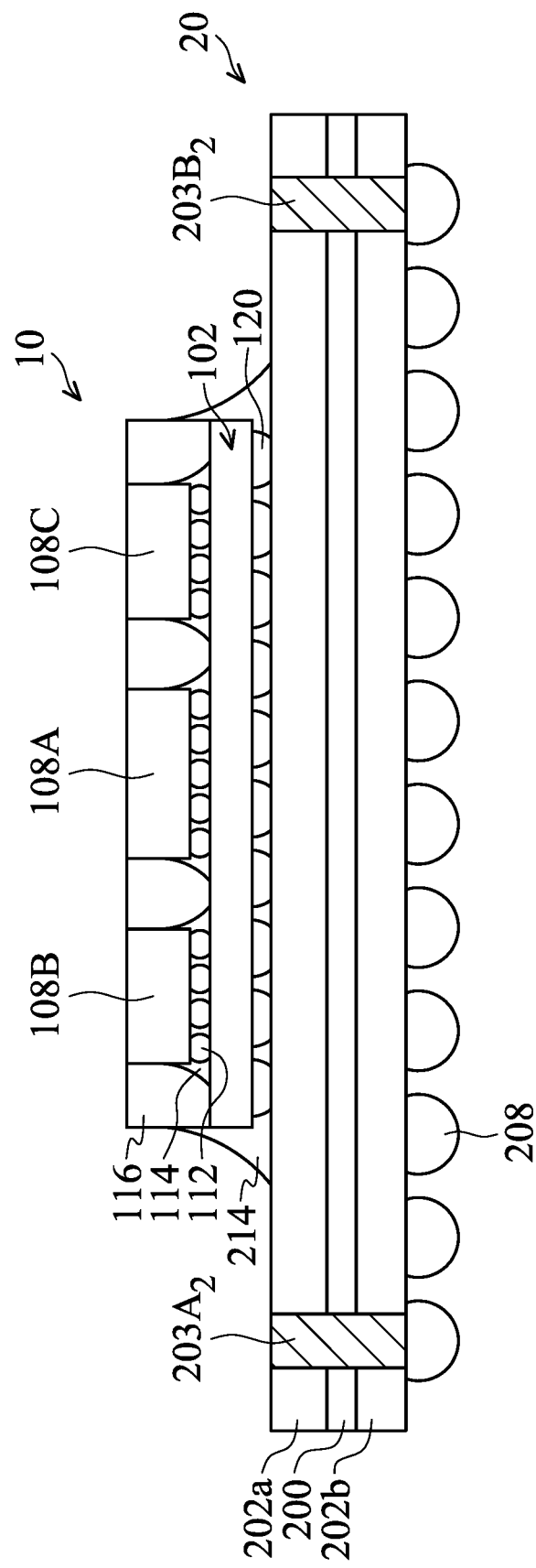
Figure 2C:
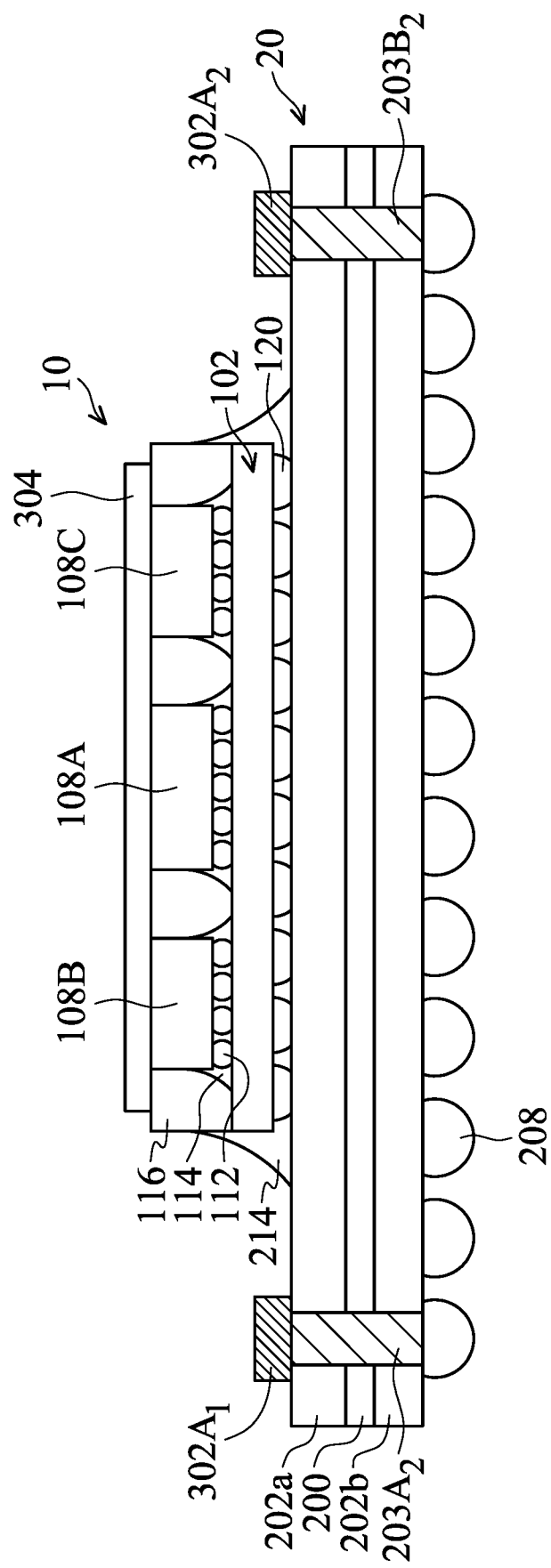
Figure 2D:
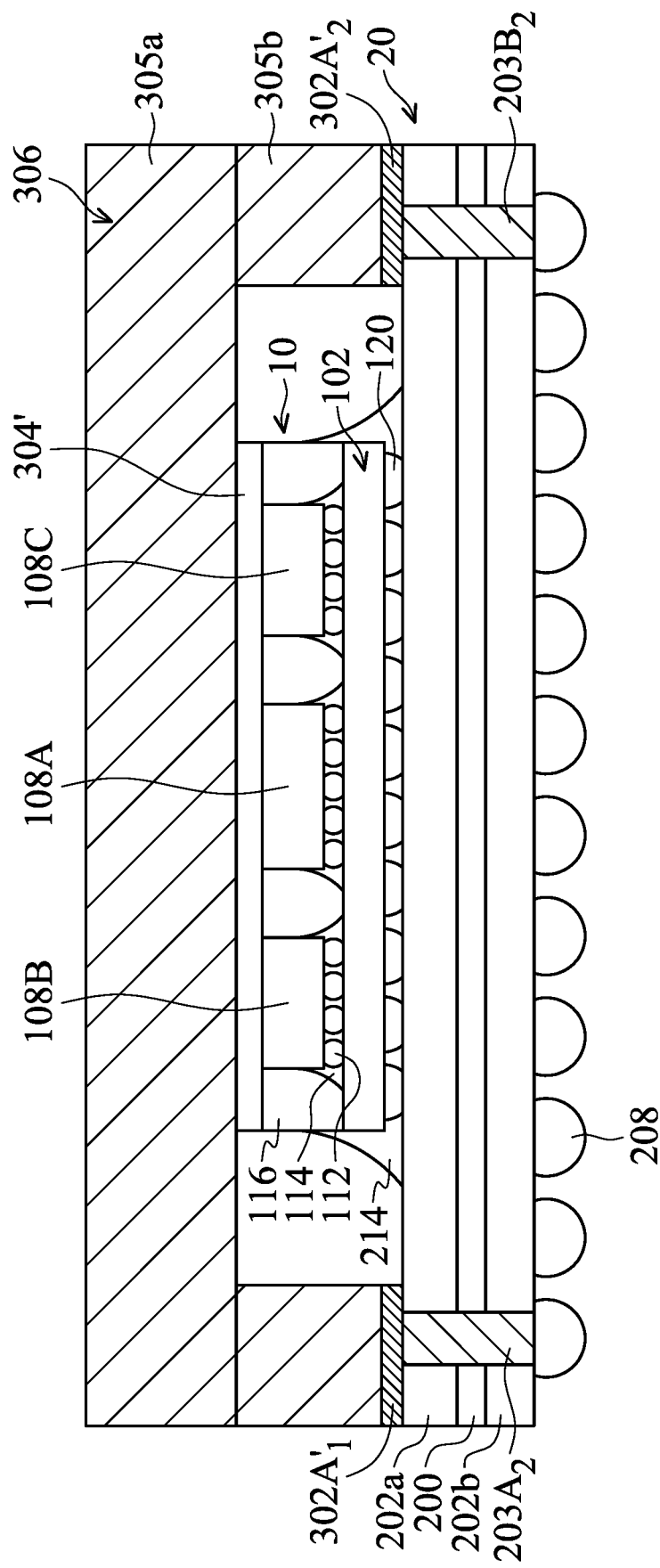
Figure 3A:
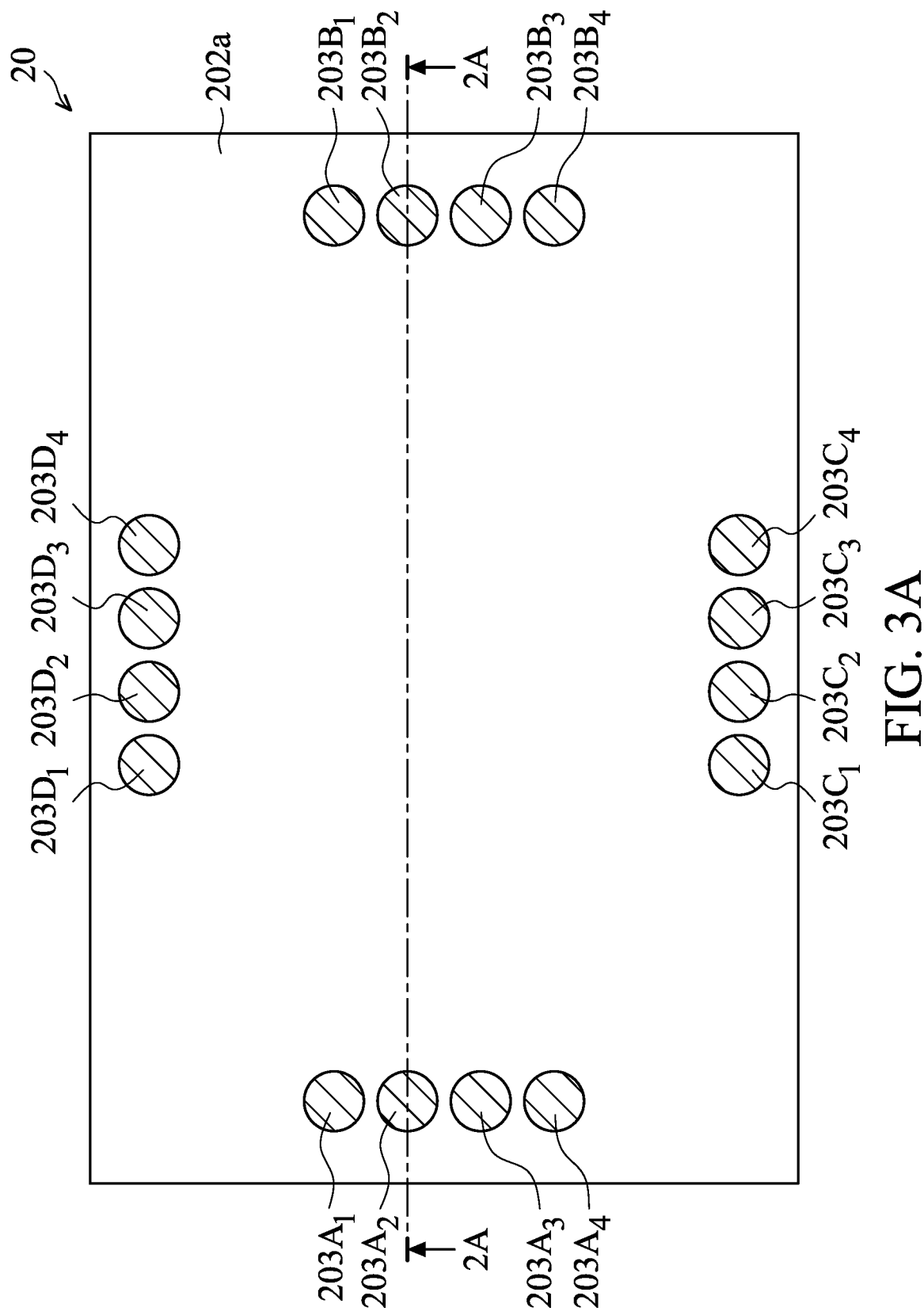
FIGS. 3A-3D are plan views of various stages of a process for forming a portion of a package structure, in accordance with some embodiments.
Figure 3B:
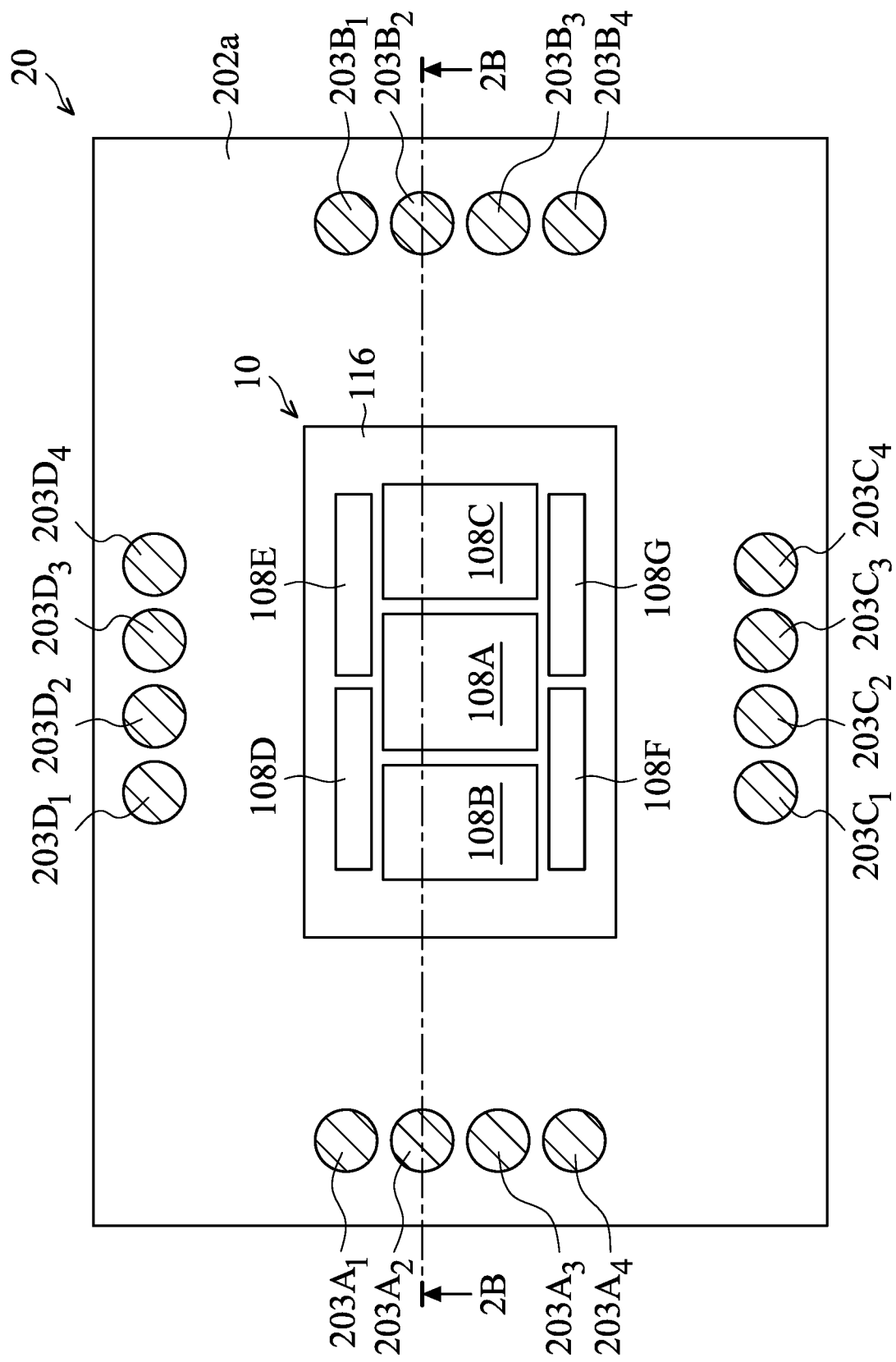
Figure 3C:
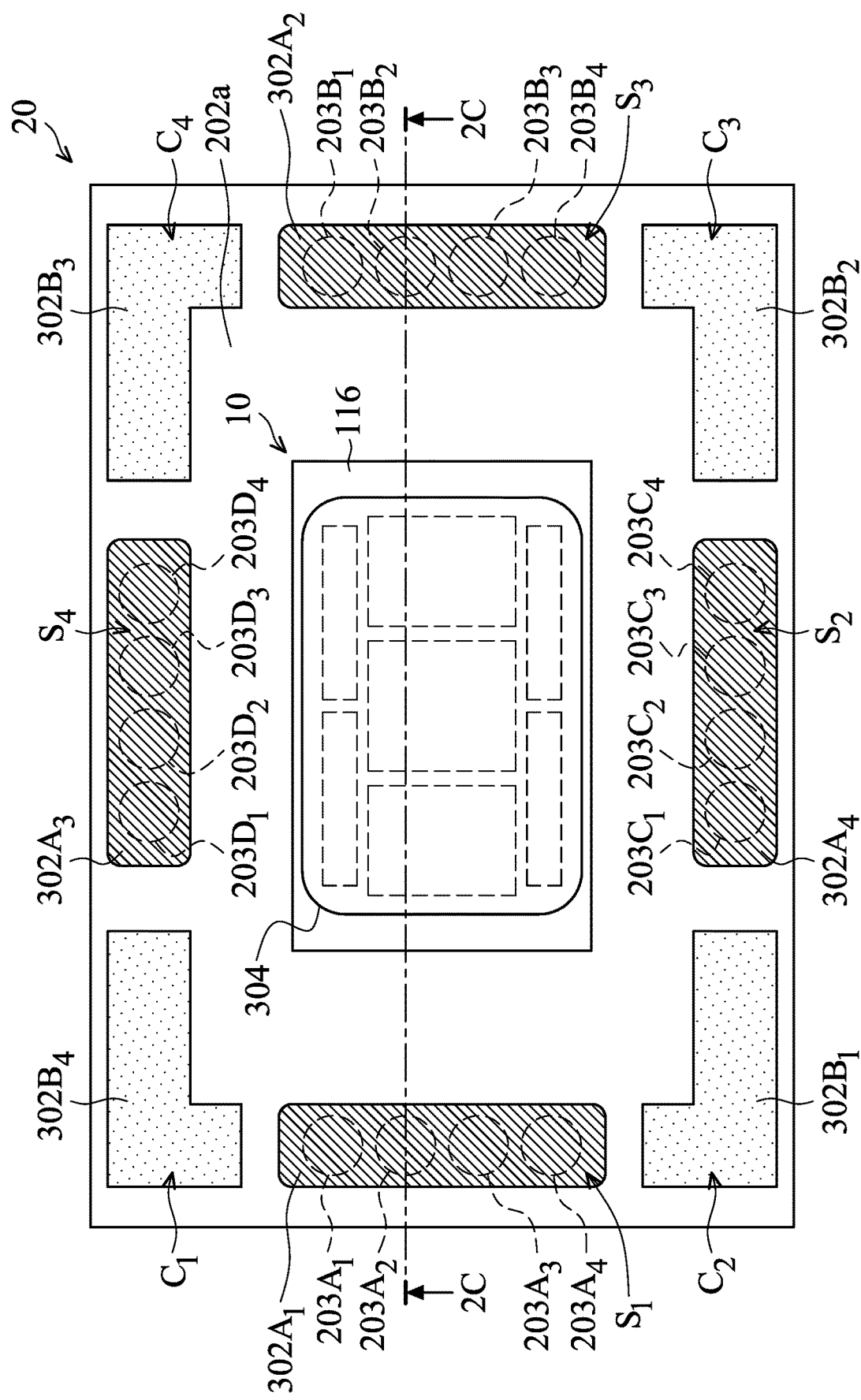
Figure 3D:
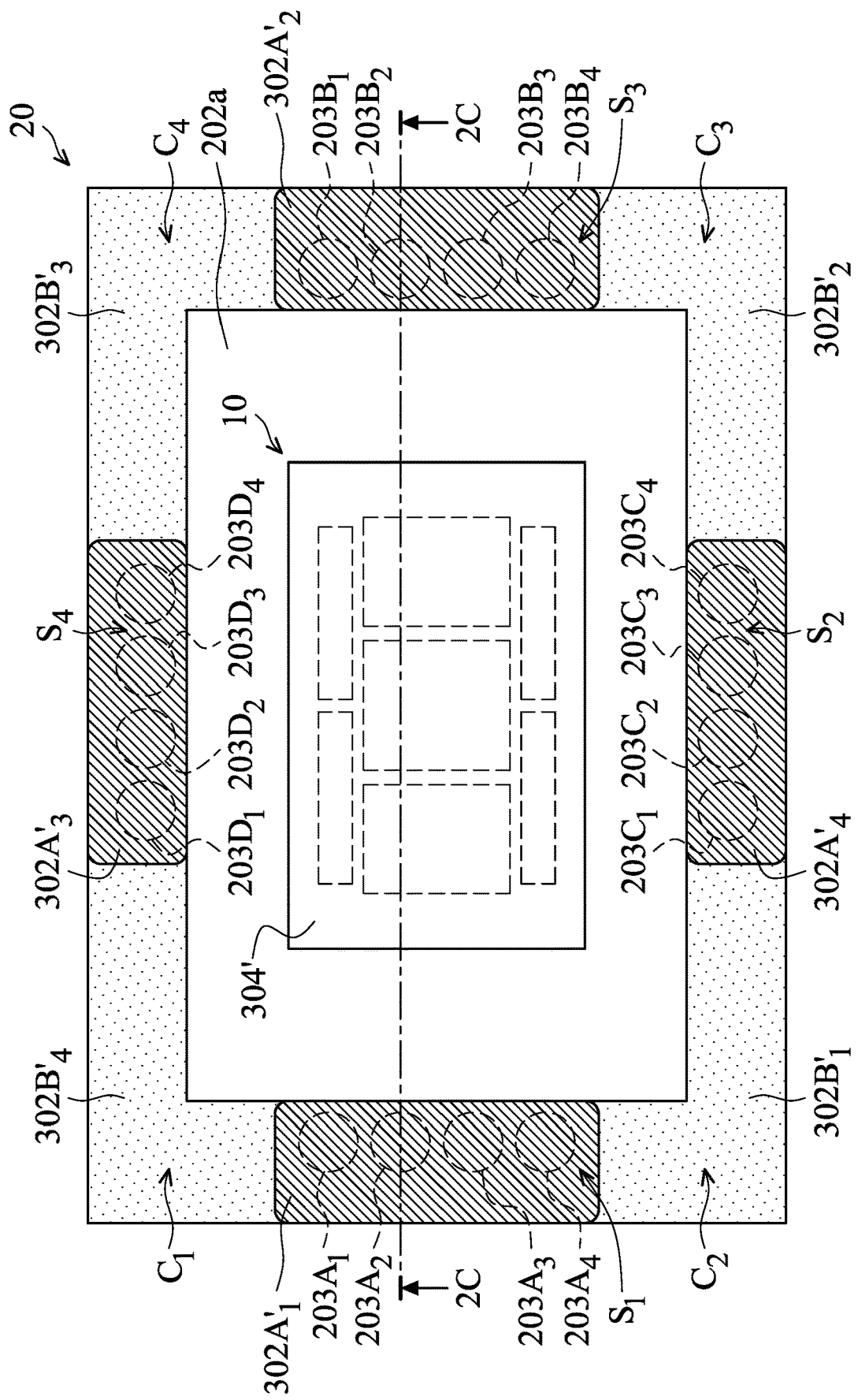

In some embodiments, FIG. 3A shows the top plan view of the structure shown in FIG. 2A. In some embodiments, FIG. 2A shows the cross-sectional view of the structure taken along the line 2A-2A in FIG. 3A. In some embodiments, FIG. 3B shows the top plan view of the structure shown in FIG. 2B. In some embodiments, FIG. 2B shows the cross-sectional view of the structure taken along the line 2B-2B in FIG. 3B. In some embodiments, FIG. 3C shows the top plan view of the structure shown in FIG. 2C. In some embodiments, FIG. 2C shows the cross-sectional view of the structure taken along the line 2C-2C in FIG. 3C. In some embodiments, FIG. 3D shows the top plan view of the structure shown in FIG. 2D. In some embodiments, FIG. 2D shows the cross-sectional view of the structure taken along the line 2D-2D in FIG. 3D.

As shown in FIGS. 2A and 3A, a substrate 20 (such as a circuit substrate or a package substrate) is received or provided. In some embodiments, the substrate 20 includes a core portion 200. The substrate 20 may further includes multiple insulating layers 202a and 202b and multiple conductive features (not shown in FIG. 2A). The conductive features may be used to route electrical signals between opposite sides of the substrate 20. The insulating layers 202a and 202b may be made of or include one or more polymer materials. The conductive features may be made of or include copper, aluminum, cobalt, tungsten, gold, one or more other suitable materials, or a combination thereof.

The core portion 200 may include organic materials such as materials that can be easily laminated. In some embodiments, the core portion 200 may include a single-sided or double-sided copper clad laminate, epoxy, resin, glass fiber, molding compound, plastic (such as polyvinylchloride (PVC), acrylonitril, butadiene and styrene (ABS), polypropylene (PP), polyethylene (PE), polystyrene (PS), polymethyl methacrylate (PMMA), polyethylene terephthalate (PET), polycarbonates (PC), polyphenylene sulfide (PPS)), one or more other suitable elements, or a combination thereof.

Conductive vias may extend through the core portion 200 to provide electrical connections between elements disposed on either side of the core portion 200. In some embodiments, the substrate 20 further includes bonding structures 208. In some embodiments, the bonding structures 208 are solder bumps. The material and formation method of the bonding structures 208 may be the same as or similar to the conductive connectors 120 shown in FIG. 1D. In some embodiments, the bonding structures 208 are used for bonding with another element such as a printed circuit board.

Many variations and/or modifications can be made to embodiments of the disclosure. In some other embodiments, the substrate 20 includes a ceramic material, a semiconductor material, a polymer material, one or more other suitable materials, or a combination thereof.

As shown in FIGS. 2A and 3A, multiple ground structures $203A_1$ to $203A_4$, $203B_1$ to $203B_4$, $203C_1$ to $203C_4$, and $203D_1$ to $203D_4$ are formed in the substrate 20, in accordance with some embodiments. In some embodiments, these ground structures $203A_1$ to $203A_4$, $203B_1$ to $203B_4$, $203C_1$ to $203C_4$, and $203D_1$ to $203D_4$ penetrate through the insulating layer 202a, the core portion 200, and the insulating layer 202b to be in electrical contact with some of the bonding structures 208.

The bonding structures 208 that are electrically connected to the ground structures $203A_1$ to $203A_4$, $203B_1$ to $203B_4$, $203C_1$ to $203C_4$, and $203D_1$ to $203D_4$ may thus function as ground bumps. In some embodiments, the top surfaces of the ground structures $203A_1$ to $203A_4$, $203B_1$ to $203B_4$, $203C_1$ to $203C_4$, and $203D_1$ to $203D_4$ may be substantially level with the top surface of the substrate 20.

In some embodiments, the ground structures $203A_1$ to $203A_4$, $203B_1$ to $203B_4$, $203C_1$ to $203C_4$, and $203D_1$ to $203D_4$ are arranged symmetrically, as shown in FIG. 3A. For example, the ground structures $203A_1$ to $203A_4$ may take the place of the ground structures $203B_1$ to $203B_4$ when the substrate 20 is turned about 180 degrees. The ground structures $203C_1$ to $203C_4$ may take the place of the ground structures $203D_1$ to $203D_4$ when the substrate 20 is turned about 180 degrees. The symmetrical arrangement of the ground structures $203A_1$ to $203A_4$, $203B_1$ to $203B_4$, $203C_1$ to $203C_4$, and $203D_1$ to $203D_4$ may help to improve the EMI protection ability of a subsequently disposed protective lid that will be illustrated in FIGS. 2D and 3D.

The ground structures $203A_1$ to $203A_4$, $203B_1$ to $203B_4$, $203C_1$ to $203C_4$, and $203D_1$ to $203D_4$ may be made of a conductive material. The conductive material may include copper, aluminum, gold, cobalt, tungsten, tin-containing solder, one or more other suitable materials, or a combination thereof. The formation of the ground structures $203A_1$ to $203A_4$, $203B_1$ to $203B_4$, $203C_1$ to $203C_4$, and $203D_1$ to $203D_4$ may involve one or more etching processes, one or more deposition (or plating) processes, and one or more planarization processes.

As shown in FIGS. 2B and 3B, a die package 10 that is the same as or similar to the die package 10 shown in FIG. 1D is received or provided. In some embodiments, the die package 10 is picked up and placed over the substrate 20. Afterwards, the die package 10 is bonded to the substrate 20 through the conductive connectors (or bonding structures) 120, as shown in FIG. 2B. As shown in FIG. 3B, the die package 10 may further include other device elements 108D-108G. The device elements 108D-108G may include chip structures, passive elements, or one or more other suitable elements.

In some embodiments, the die package 10 is disposed over the substrate 20 such that the conductive pads of the substrate 20 are in direct contact with the bonding structures 120. In some other embodiments, additional solder elements may be formed on the conductive pads of the substrate 20 before the die package 10 is disposed over the substrate 20. Afterwards, a thermal reflow process and/or a thermal compression process are used to bond the die package 10 to the substrate 20.

Afterwards, an underfill material is dispensed onto the substrate 20 along one side of the die package 10, in accordance with some embodiments. The underfill material may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof. The underfill material may be drawn into the space between the die package 10 and the substrate 20 to surround some of the bonding structures 120 by the capillary force. In some embodiments, the underfill material is thermally heated and cured to form an underfill structure 214. As a result, the underfill structure 214 that surrounds the bonding structures 120 is formed, as shown in FIG. 2B. In FIG. 3B, for the sake of simplicity and clarity, the underfill structure 214 is not shown.

As shown in FIGS. 2C and 3C, first adhesive glues $302A_1$, $302A_2$, $302A_3$, and $302A_4$ and second adhesive glues $302B_1$, $302B_2$, $302B_3$, and $302B_4$ are dispensed or applied over the substrate 20, in accordance with some embodiments. In some embodiments, the first adhesive glues $302A_1$, $302A_2$, $302A_3$, and $302A_4$ are dispensed over side portions $S_1$, $S_2$, $S_3$, and $S_4$ where the ground structures $203A_1$ to $203A_4$, $203B_1$ to $203B_4$, $203C_1$ to $203C_4$, and $203D_1$ to $203D_4$ are positioned, as shown in FIG. 3C. The first adhesive glues $302A_1$, $302A_2$, $302A_3$, and $302A_4$ cover the ground structures $203A_1$ to $203A_4$, $203B_1$ to $203B_4$, $203C_1$ to $203C_4$, and $203D_1$ to $203D_4$. In FIG. 3C, the covered ground structures $203A_1$ to $203A_4$, $203B_1$ to $203B_4$, $203C_1$ to $203C_4$, and $203D_1$ to $203D_4$ are illustrated in dashed lines.

In some embodiments, the second adhesive glues $302B_1$, $302B_2$, $302B_3$, and $302B_4$ of the substrate 20 are dispensed over corner portions $C_1$, $C_2$, $C_3$, and $C_4$ of the substrate 20, as shown in FIG. 3C. In some embodiments, the first adhesive glues $302A_1$-$302A_4$ and the second adhesive glues $302B_1$-$302B_4$ are separated from each other. However, embodiments of the disclosure are not limited thereto. In some other embodiments, some of the first adhesive glues $302A_1$-$302A_4$ and the second adhesive glues $302B_1$-$302B_4$ are in direct contact with each other.

In some embodiments, the first adhesive glues $302A_1$-$302A_4$ are dispensed before the second adhesive glues $302B_1$-$302B_4$. In some other embodiments, the first adhesive glues $302A_1$-$302A_4$ are dispensed after the second adhesive glues $302B_1$-$302B_4$.

In some embodiments, the first adhesive glues $302A_1$-$302A_4$ and the second adhesive glues $302B_1$-$302B_4$ are made of different materials.

In some embodiments, the first adhesive glues $302A_1$-$302A_4$ are electrically conductive glues, and the second adhesive glues $302B_1$-$302B_4$ are electrical non-conductive glues. The first adhesive glues $302A_1$-$302A_4$ may have a first electrical resistivity, and the second adhesive glues $302B_1$-$302B_4$ may have a second electrical resistivity. The second resistivity is greater than the first resistivity. For example, the first electrical resistivity may be in a range from about 0.0001 ohm-cm to about 0.0004 ohm-cm. The second resistivity may be in a range from about 1014 ohm-cm to about 1016 ohm-cm.

Because the first adhesive glues $302A_1$-$302A_4$ are electrically conductive glues, the first adhesive glues $302A_1$-$302A_4$ may be used to form electrically conductive adhesive elements later. The electrically conductive adhesive elements may form electrical connection between the ground structures $203A_1$ to $203A_4$, $203B_1$ to $203B_4$, $203C_1$ to $203C_4$, and $203D_1$ to $203D_4$ and a subsequently disposed protective lid that may be made of a conductive material. Due to the electrical connection, the protective lid is thus electrically grounded. As a result, the protective lid may also be used to prevent or reduce electromagnetic interference (EMI) from being transmitted to and/or from the chip structures below the protective lid. The reliability and performance of the package structure are thus greatly improved.

In some embodiments, the first adhesive glues $302A_1$-$302A_4$ and the second adhesive glues $302B_1$-$302B_4$ include a polymer material with fillers dispersed therein. The polymer material may include an epoxy-based resin. The fillers in the first adhesive glues $302A_1$-$302A_4$ may include silver particles, gold particle, silver fibers, gold fibers, one or more other suitable fillers, or a combination thereof. The fillers in the second adhesive glues $302B_1$-$302B_4$ may include silica particles, alumina particle, silica fibers, alumina fibers, one or more other suitable fillers, or a combination thereof.

However, embodiments of the disclosure are not limited thereto. In some embodiments, the second adhesive glues $302B_1$-$302B_4$ contain no fillers. In some embodiments, the first adhesive glues $302A_1$-$302A_4$ are silver-containing epoxy-based glues, and the second adhesive glues $302B_1$-$302B_4$ are silicone-based glues.

The first adhesive glues $302A_1$-$302A_4$ may have a first storage modulus, and the second adhesive glues $302B_1$-$302B_4$ may have a second storage modulus. In some embodiments, the first storage modulus is greater than the second storage modulus. At the room temperature, the first storage modulus may be in a range from about 0.5 GPa to about 6 GPa. At the room temperature, the second storage modulus may be in a range from about 0.005 GPa to about 0.01 GPa.

The first adhesive glues $302A_1$-$302A_4$ may have a first coefficient of thermal expansion, and the second adhesive glues $302B 1$-$302B_4$ may have a second coefficient of thermal expansion. In some embodiments, the second coefficient of thermal expansion is greater than the first coefficient of thermal expansion.

The first adhesive glues $302A_1$-$302A_4$ may have a first viscosity, and the second adhesive glues $302B_1$-$302B_4$ may have a second viscosity. In some embodiments, the second viscosity is greater than the first viscosity. The first viscosity may be in a range from about 20 Pa-s to about 100 Pa-s. For example, the first viscosity may be about 25 Pa-s or about 50 Pa-s. The second viscosity may be in a range from about 150 Pa-s to about 600 Pa-s. For example, the second viscosity may be about 400 Pa-s.

The first adhesive glues $302A_1$-$302A_4$ may have a first glass transition temperature, and the second adhesive glues $302B_1$-$302B_4$ may have a second glass transition temperature. In some embodiments, the first glass transition temperature is greater than the second glass transition temperature. The first glass transition temperature may be in a range from about 10 degrees C. to about 150 degrees C. For example, the first glass transition temperature may be about 11 degrees C. or about 120 degrees C. The second glass transition temperature may be lower than 0 degrees C.

In simulation results of some embodiments made after a protective lid is attached to the substrate 20, the first adhesive glues $302A_1$-$302A_4$ that have the higher storage modulus may cause higher crack risk of the protective layer 116 and/or the underfill structure 114. Accordingly, in some embodiments, the first adhesive glues $302A_1$-$302A_4$ that have the higher storage modulus are positioned at the side portions $S_1$ to $S_4$. Since the thermal stress at the side portions $S_1$ to $S_4$ of the substrate 20 is lower than that at the corner portions $C_1$ to $C_4$ of the substrate 20, the risk of cracking may be maintained at an acceptable level even if the first adhesive glues $302A_1$-$302A_4$ are applied.

In some embodiments, the ground structures $203A_1$ to $203A_4$, $203B_1$ to $203B_4$, $203C_1$ to $203C_4$, and $203D_1$ to $203D_4$ are designed to be positioned in the side portions $S_1$ to $S_4$ of the substrate 20 so as to be covered by the first adhesive glues $302A_1$-$302A_4$. Therefore, the first adhesive glues $302A_1$-$302A_4$ on the side portions $S_1$ to $S_4$ may thus be in electrical contact with the ground structures $203A_1$ to $203A_4$, $203B_1$ to $203B_4$, $203C_1$ to $203C_4$, and $203D_1$ to $203D_4$ without causing high risk of cracking.

In some embodiments, the second adhesive glues $302B_1$-$302B_4$ that have the lower storage modulus are positioned at the corner portions $C_1$ to $C_4$ of the substrate 20 to compensate the higher corner stress caused due to the coefficient of thermal expansion (CTE) mismatch between the substrate 20 and the subsequently attached protective lid and/or the CTE mismatch between the substrate 20 and the die package 10.

The first adhesive glues $302A_1$-$302A_4$ may occupy a first area of the substrate 20, and the second adhesive glues $302B_1$-$302B_4$ may occupy a second area of the substrate 20. In some embodiments, the second area is larger than the first area.

As shown in FIGS. 2C and 3C, a thermally conductive glue 304 is dispensed or applied on the top of the die package 10, in accordance with some embodiments. As shown in FIG. 3C, the chip structures that are covered by the thermally conductive glue 304 are illustrated in dashed lines for the sake of simplicity and clarity. In some embodiments, the thermally conductive glue 304 is dispensed or applied after the first adhesive glues $302A_1$-$302A_4$ and the second adhesive glues $302B_1$-$302B_4$ are dispensed or applied. In some other embodiments, the thermally conductive glue 304 is dispensed or applied before the first adhesive glues $302A_1$-$302A_4$ and the second adhesive glues $302B_1$-$302B_4$ are dispensed or applied.

Many variations and/or modifications can be made to embodiments of the disclosure. In some embodiments, one or more of the first adhesive glues $302A_1$-$302A_4$ is/are replaced with one or more first adhesive tape(s). In some embodiments, one or more of the second adhesive glues $302B_1$-$302B_4$ is/are replaced with one or more second adhesive tape(s). In some embodiments, the thermally conductive glue 304 is replaced with a thermally conductive tape.

As shown in FIG. 2D, a protective lid 306 is disposed over the die package 10 and the substrate 20, in accordance with some embodiments. The protective lid 306 may function as a warpage-control element and/or a heat spreader. The protective lid 306 may include an upper plate 305a and a support structure 305b. In some embodiments, the protective lid 306 and the substrate 20 together surround an enclosed (or sealed) space where the die package 10 is positioned.

In some embodiments, the upper plate 305a and the support structure 305b are formed in one piece. In some other embodiments, the upper plate 305a and the support structure 305b are two separate pieces that are bonded together through a conductive glue therebetween. In some embodiments, the protective lid 306 is made of a conductive material such as a metal material or a doped semiconductor material. The conductive material may include steel, aluminum, gold, copper, a doped semiconductor material, one or more other suitable materials, or a combination thereof.

In some embodiments, the protective lid 306 is attached to the substrate 20 through first adhesive elements $302A'_1$-

302A'$_4$ and second adhesive elements 302B'$_1$-302B'$_4$, as shown in FIGS. 2D and 3D. In some embodiments, a thermal operation is performed to the first adhesive elements 302A'$_1$-302A'$_4$ and second adhesive elements 302B'$_1$-302B'$_4$ after the protective lid 306 is attached to the substrate 20, so as to enhance the adhesion between the protective lid 306 and the substrate 20. The operation temperature may be in a range from about 120 degrees C. to about 180 degrees C. The operation time may be in a range from about 200 seconds to about 2 hours. In some other embodiments, another thermal operation is performed to the first adhesive elements 302A'$_1$-302A'$_4$ and second adhesive elements 302B'$_1$-302B'$_4$ before the protective lid 306 is attached to the substrate 20.

In some embodiments, the protective lid 306 is attached to the die package 10 through a thermally conductive element 304'. As mentioned above, in some embodiments, FIG. 3D shows the top plan view of the structure shown in FIG. 2D, and FIG. 2D shows the cross-sectional view of the structure taken along the line 2D-2D in FIG. 3D. For the sake of simplicity and clarity, the protective lid 306 is not shown in FIG. 3D.

In some embodiments, the first adhesive glues 302A$_1$-302A$_4$ and the second adhesive glues 302B$_1$-302B$_4$ are squeezed by the support structure 305b of the protective lid 306. The first adhesive glues 302A$_1$-302A$_4$ and the second adhesive glues 302B$_1$-302B$_4$ thus become thinner and occupy larger area of the substrate 20. The first adhesive glues 302A$_1$-302A$_4$ and the second adhesive glues 302B$_1$-302B$_4$ are spread between the protective lid 306 and the substrate 20. As a result, as shown in FIGS. 2D and 3D, the first adhesive elements 302A'$_1$-302A'$_4$ and the second adhesive elements 302B'$_1$-302B'$_4$ are formed. Similarly, the thermally conductive glue 304 is spread between the protective lid 306 and the die package 10. As a result, the thermally conductive element 304' is formed.

In some embodiments, the outer edge of the first adhesive element 302A'1 is substantially aligned with the sidewall of the substrate 20 and/or the outer sidewall of the support structure 305b of the protective lid 306, as shown in FIGS. 2D and 3D. In some embodiments, the edge of the thermally conductive element 304' is substantially aligned with the sidewall of the die package 10, as shown in FIGS. 2D and 3D.

In some embodiments, the first adhesive glues 302A$_1$-302A$_4$ and the second adhesive glues 302B$_1$-302B$_4$ are separated from each other before the protective lid 306 is disposed over the substrate 20, as shown in FIGS. 2C and 3C. After the protective lid 306 is disposed, the first adhesive glues 302A$_1$-302A$_4$ and the second adhesive glues 302B$_1$-302B$_4$ extend towards each other to form the first adhesive elements 302A'$_1$-302A'$_4$ and the second adhesive elements 302B'$_1$-302B'$_4$. In some embodiments, each of the first adhesive elements 302A'$_1$-302A'$_4$ is in direct contact with two of the second adhesive elements 302B'$_1$-302B'$_4$, as shown in FIG. 3D.

However, embodiments of the disclosure are not limited thereto. Many variations and/or modifications can be made to embodiments of the disclosure. In some other embodiments, some of the first adhesive glues 302A$_1$-302A$_4$ and the second adhesive glues 302B$_1$-302B$_4$ are in direct contact with each other before the protective lid 306 is attached to the substrate 20.

As mentioned above, the first adhesive elements 302A'$_1$-302A'$_4$ are formed from electrically conductive glues. Therefore, the first adhesive elements 302A'1-302A'$_4$ are also electrically conductive and are capable of forming electrical connection between the protective lid 306 and the ground structures 203A$_1$ to 203A$_4$, 203B$_1$ to 203B$_4$, 203C$_1$ to 203C$_4$, and 203D$_1$ to 203D$_4$. The protective lid 306 is thus electrically grounded and may also be used to prevent or reduce electromagnetic interference (EMI) from being transmitted to and/or from the die package 10 protected by the protective lid 306. The reliability and performance of the package structure are thus greatly improved.

In some embodiments, the first adhesive elements 302A'$_1$-302A'$_4$ are positioned on the side portions S$_1$ to S$_4$ of the substrate 20 without being positioned on the corner portions C$_1$ to C$_4$ of the substrate 20. The risk of cracking of the package structure may thus be maintained at an acceptable level.

In some embodiments, the second adhesive elements 302B'$_1$-302B'$_4$ are positioned on the corner portions C$_1$ to C$_4$ of the substrate 20. The second adhesive elements 302B'$_1$-302B'$_4$ may be used to compensate the higher thermal stress near the corner portions C$_1$ to C$_4$. In some embodiments, due to the hybrid adhesive elements including the first adhesive elements 302A'$_1$-302A'$_4$ and the second adhesive elements 302B'$_1$-302B'$_4$, the EMI problems and the package reliability issues may be reduced or prevented at the same time.

Figure 4:
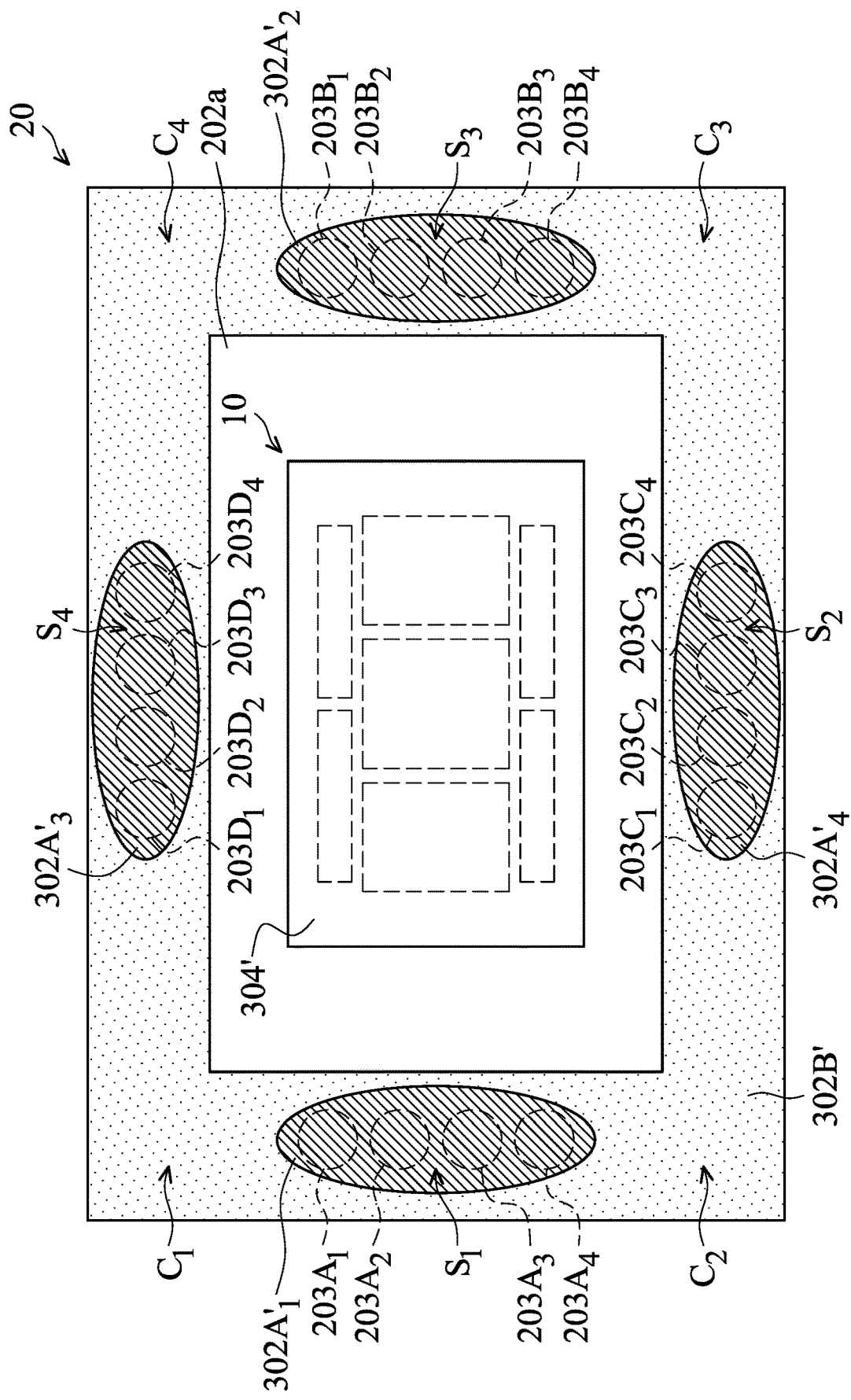
FIG. 4 is a plan view of a portion of a package structure, in accordance with some embodiments.

Many variations and/or modifications can be made to embodiments of the disclosure. FIG. 4 is a plan view of a portion of a package structure, in accordance with some embodiments. In some embodiments, each of the first adhesive elements 302A'1-302A'$_4$ is separated from the sidewalls of the substrate 20 by a portion of a second adhesive element 302B'. In some embodiments, each of the first adhesive elements 302A'$_1$-302A'$_4$ is continuously surrounded by the second adhesive element 302B'.

Figure 5:
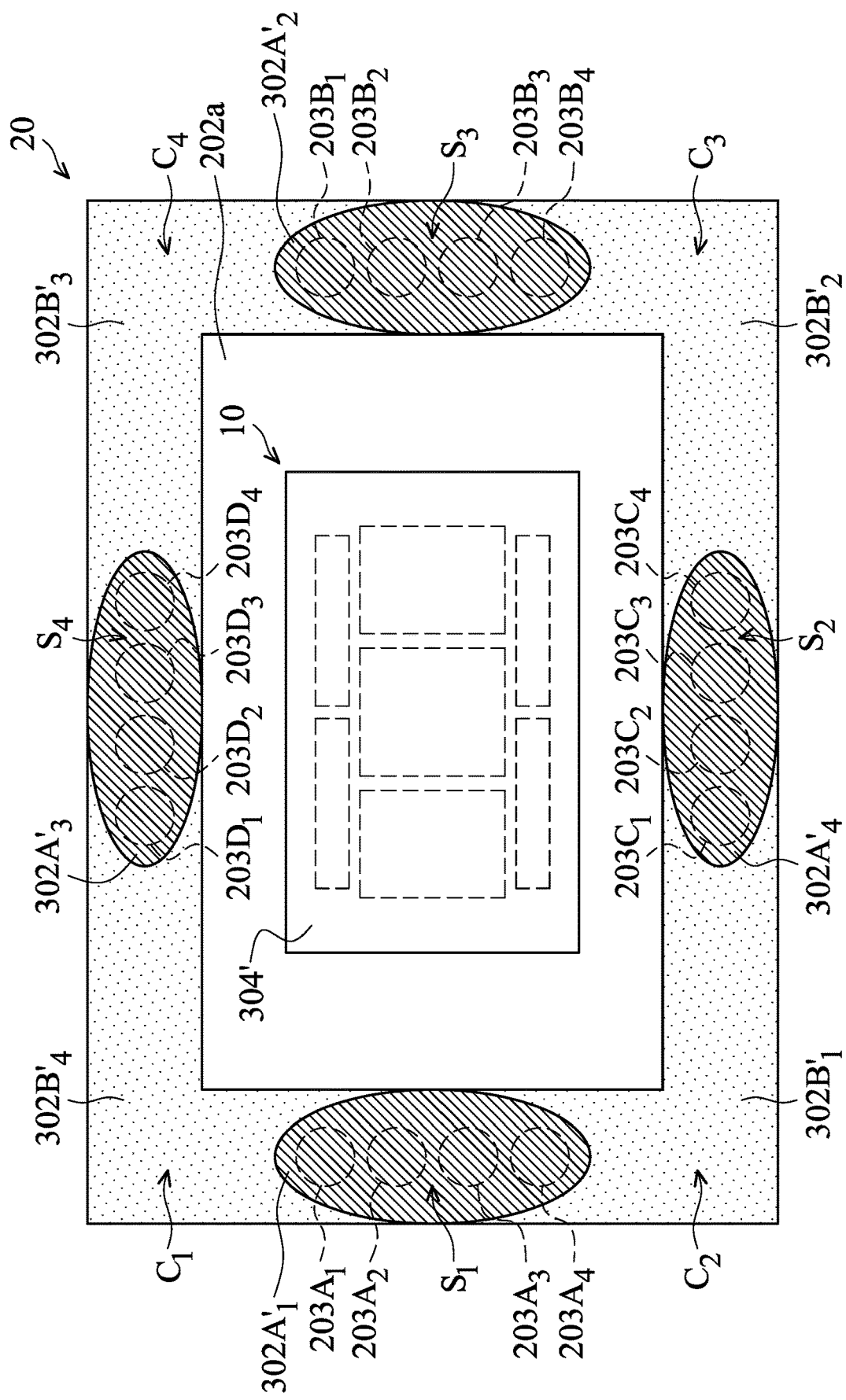
FIG. 5 is a plan view of a portion of a package structure, in accordance with some embodiments.

Many variations and/or modifications can be made to embodiments of the disclosure. FIG. 5 is a plan view of a portion of a package structure, in accordance with some embodiments. Similar to the embodiments illustrated in FIG. 3D, multiple first adhesive elements 302A'$_1$-302A'$_4$ and multiple second adhesive elements 302B'$_1$-302B'$_4$ are used to attach the protective lid 306 to the substrate 20.

The first adhesive elements 302A'$_1$-302A'$_4$ in FIG. 5 may have different top view shape than those of the first adhesive elements 302A'$_1$-302A'$_4$ in FIG. 3D. In some embodiments, the first adhesive elements 302A'$_1$-302A'$_4$ have an oval-like top view shape, as shown in FIG. 5. In some embodiments, one or some of the first adhesive elements 302A'$_1$-302A'$_4$ partially cover the substrate 20 that is not directly below the support structure 305b of the protective lid 306.

In some embodiments, each of the first adhesive elements 302A'$_1$-302A'$_4$ covers two or more ground structures. However, embodiments of the disclosure are not limited thereto. Many variations and/or modifications can be made to embodiments of the disclosure. In some other embodiments, one or some of the first adhesive elements 302A'$_1$-302A'$_4$ covers only one ground structure.

Figure 6:
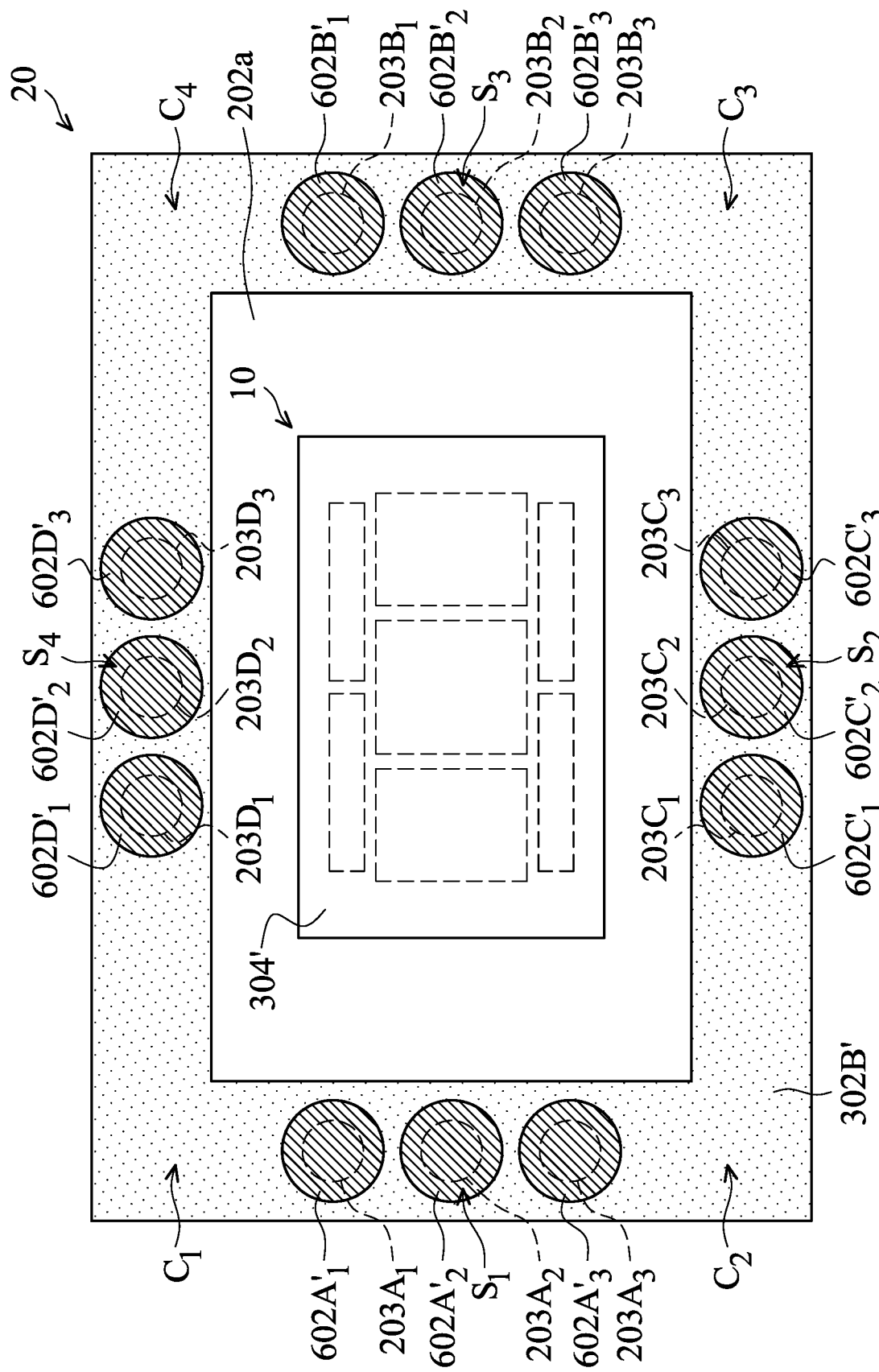
FIG. 6 is a plan view of a portion of a package structure, in accordance with some embodiments.

FIG. 6 is a plan view of a portion of a package structure, in accordance with some embodiments. In some embodiments, multiple first adhesive elements 602A'$_1$ to 602A'3 are formed over the side portion S$_1$ of the substrate 20. The material and formation method of the first adhesive elements 602A'$_1$ to 602A'$_3$ may be the same as or similar to those of the first adhesive elements 302A'$_1$ to 302A'$_4$.

In some embodiments, each of the first adhesive elements 602A'$_1$ to 602A'$_3$ covers and is in electrical contact with one respective ground structure. For example, the first adhesive elements 602A'$_1$, 602A'$_2$, and 602A'$_3$ cover the ground structures 203A$_1$, 203A$_2$, and 203A$_3$, respectively. Similarly, in some embodiments, multiple first adhesive elements 602B'₁ to 602B'₃ are formed over the side portion S₃ of the substrate 20 to cover the ground structures 203B₁, 203B₂, and 203B₃, respectively. Multiple first adhesive elements 602C'₁ to 602C'₃ are formed over the side portion S₂ of the substrate 20 to cover the ground structures 203C₁, 203C₂, and 203C₃, respectively. Multiple first adhesive elements 602D'₁ to 602D'₃ are formed over the side portion S₄ of the substrate 20 to cover the ground structures 203D₁, 203D₂, and 203D₃, respectively.

In some embodiments, each of the first adhesive elements 602A'₁ to 602A'₃, 602B'₁ to 602B'₃, 602C'₁ to 602C'₃, and 602D'₁ to 602D'₃ is surrounded by a second adhesive element 302B'. The second adhesive element 302B' may help to reduce the risk of cracking of the package structure while the first adhesive elements 602A'₁ to 602A'₃, 602B'₁ to 602B'₃, 602C'₁ to 602C'₃, and 602D'₁ to 602D'₃ form electrical connection between the protective lid 306 and the ground structures.

In some embodiments, the top surfaces of the ground structures are substantially level with the top surface of the substrate 20. However, embodiments of the disclosure are not limited thereto. Many variations and/or modifications can be made to embodiments of the disclosure. In some other embodiments, the top surfaces of the ground structures are at one or more different height levels than the top surface of the substrate 20.

Figure 7:
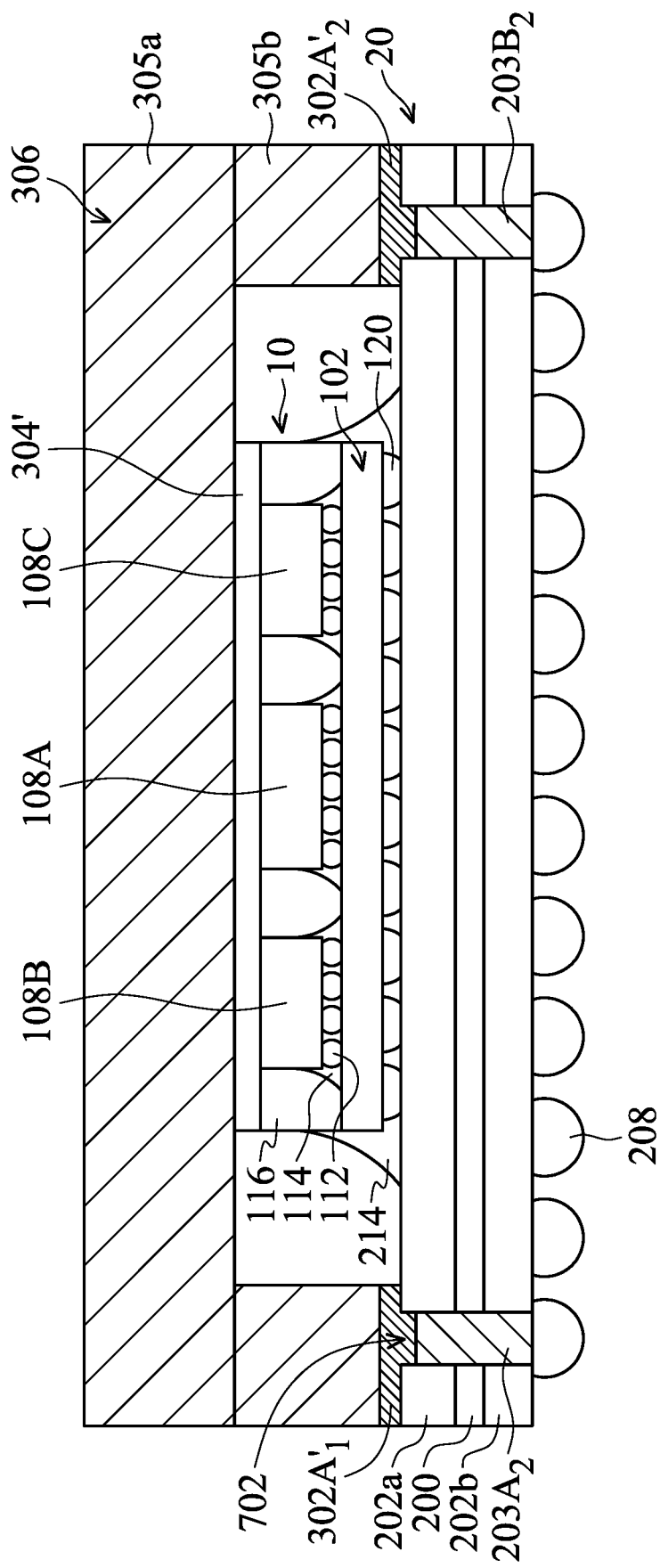
FIG. 7 is a cross-sectional view of a portion of a package structure, in accordance with some embodiments.

FIG. 7 is a cross-sectional view of a portion of a package structure, in accordance with some embodiments. In some embodiments, the top surfaces of the ground structures 203A₂ and 203B₂ are lower than the top surface of the substrate 20, as shown in FIG. 7. In some embodiments, a structure similar to the structure shown in FIG. 2A is provided. Afterwards, an etch back process is used to partially remove the ground structures 203A₂ and 203B₂. As a result, recesses are formed on the ground structures 203A₂ and 203B₂. Afterwards, processes similar to those illustrated in FIGS. 2B-2D and 3B-3D are performed. As a result, the structure shown in FIG. 7 is formed.

In some embodiments, the first adhesive elements 302A'₁ and 302A'₂ have protruding portions 702 that fill the recesses on the ground structures 203A₂ and 203B₂. The protruding portions 702 may help to enhance the adhesion between the protective lid 306 and the substrate 20.

Figure 8:
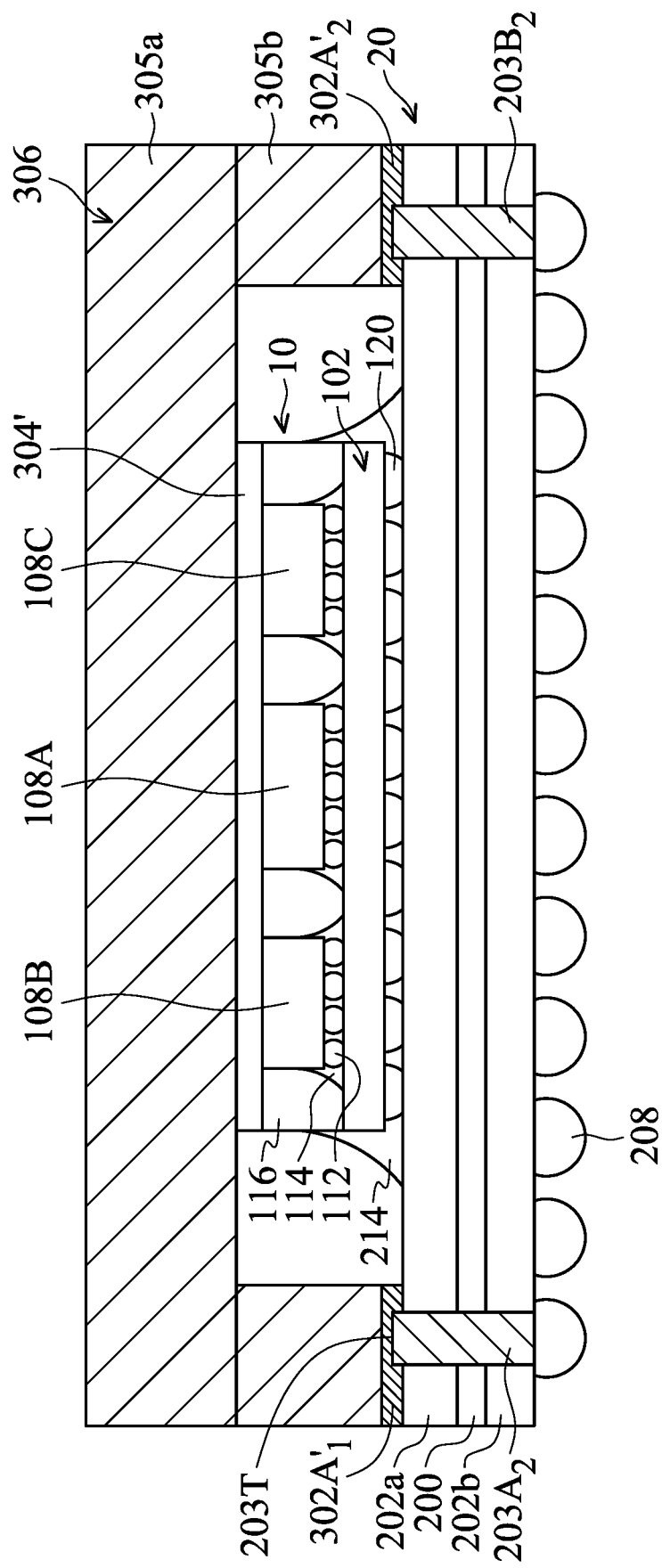
FIG. 8 is a cross-sectional view of a portion of a package structure, in accordance with some embodiments.

Many variations and/or modifications can be made to embodiments of the disclosure. FIG. 8 is a cross-sectional view of a portion of a package structure, in accordance with some embodiments. In some embodiments, the ground structures 203A₂ and 203B₂ protrude from the top surface of the substrate 20. In some embodiments, the ground structures 203A₂ and 203B₂ extend upwards into the first adhesive elements 302A'₁ and 302A'₂, as shown in FIG. 8. The top surfaces 203T of the ground structures 203A₂ and 203B₂ are positioned at a height level that is higher than the top surface of the substrate 20. The top surfaces 203T of the ground structures 203A₂ and 203B₂ is between the top surface and the bottom surface of the first adhesive element 302A'₁ or 302A'₂.

In some embodiments illustrated in FIGS. 2D, 7, and 8, the ground structures are surrounded by the substrate 20. However, embodiments of the disclosure are not limited thereto. Many variations and/or modifications can be made to embodiments of the disclosure. In some other embodiments, some or all of the ground structures are formed outside of the substrate 20 without being surrounded by the substrate 20.

Figure 9:
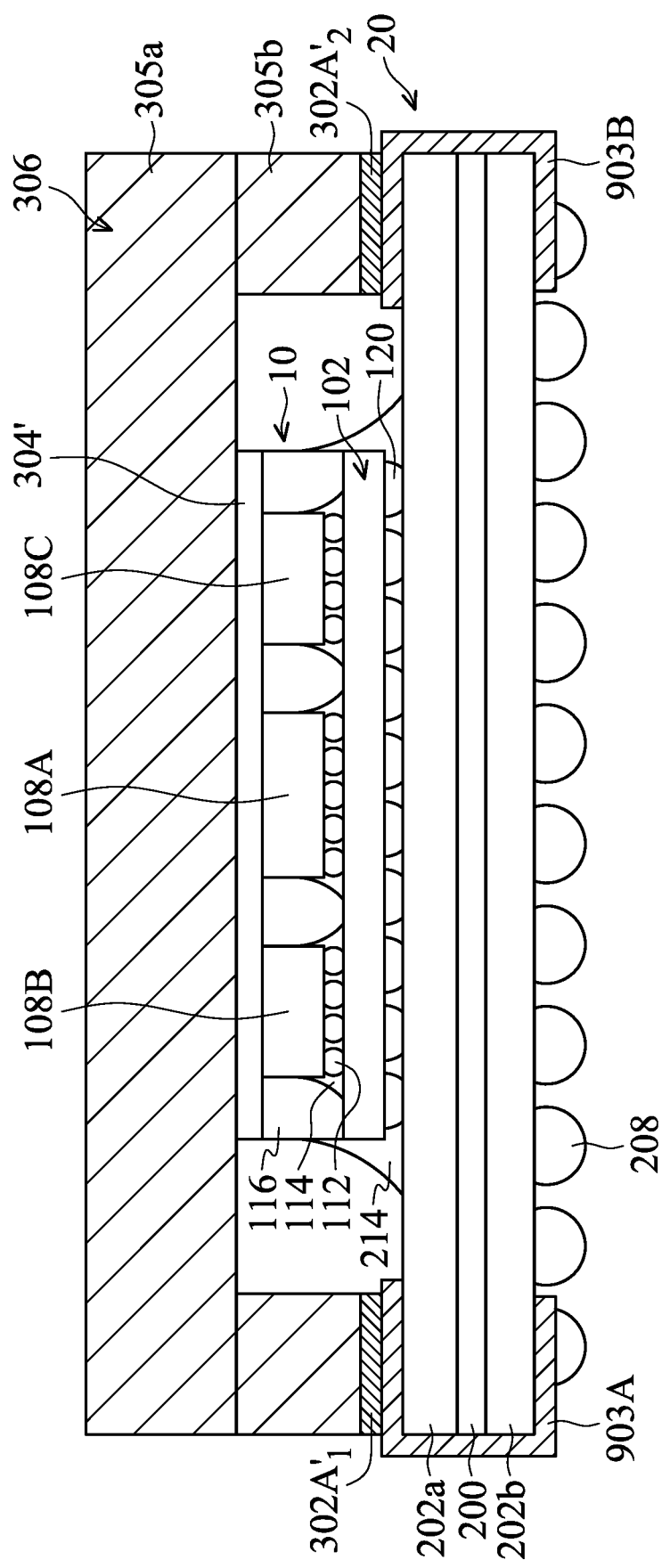
FIG. 9 is a cross-sectional view of a portion of a package structure, in accordance with some embodiments.

FIG. 9 is a cross-sectional view of a portion of a package structure, in accordance with some embodiments. In some embodiments, ground structures 903A and 903B are formed along the sidewalls of the substrate 20. Some of the bonding structures 208 are formed to be in electrical contact with the ground structures 903A and 903B and function as ground bumps. Afterwards, the processes similar to those illustrated in FIGS. 2B-2D and 3B-3D are performed. As a result, the structure shown in FIG. 9 is formed. The first adhesive elements 302A'₁ and 302A'₂ form the electrical connection between the protective lid 306 and the ground structures 903A and 903B. Therefore, the protective lid 306 is electrically grounded and is capable of reducing or preventing electromagnetic interference (EMI) to and/or from the one or more chip structures and/or packages below the protective lid 306.

In some embodiments shown in FIGS. 2D, 7, 8, and 9, the inner sidewalls of the first adhesive elements and/or the second adhesive elements are substantially aligned with the inner sidewalls of the support structure 305b of the protective lid 306. However, embodiments of the disclosure are not limited thereto. Many variations and/or modifications can be made to embodiments of the disclosure. In some other embodiments, the inner sidewalls of the first adhesive elements and/or the second adhesive elements are misaligned with the inner sidewall of the support structure 305b of the protective lid 306.

Figure 10:
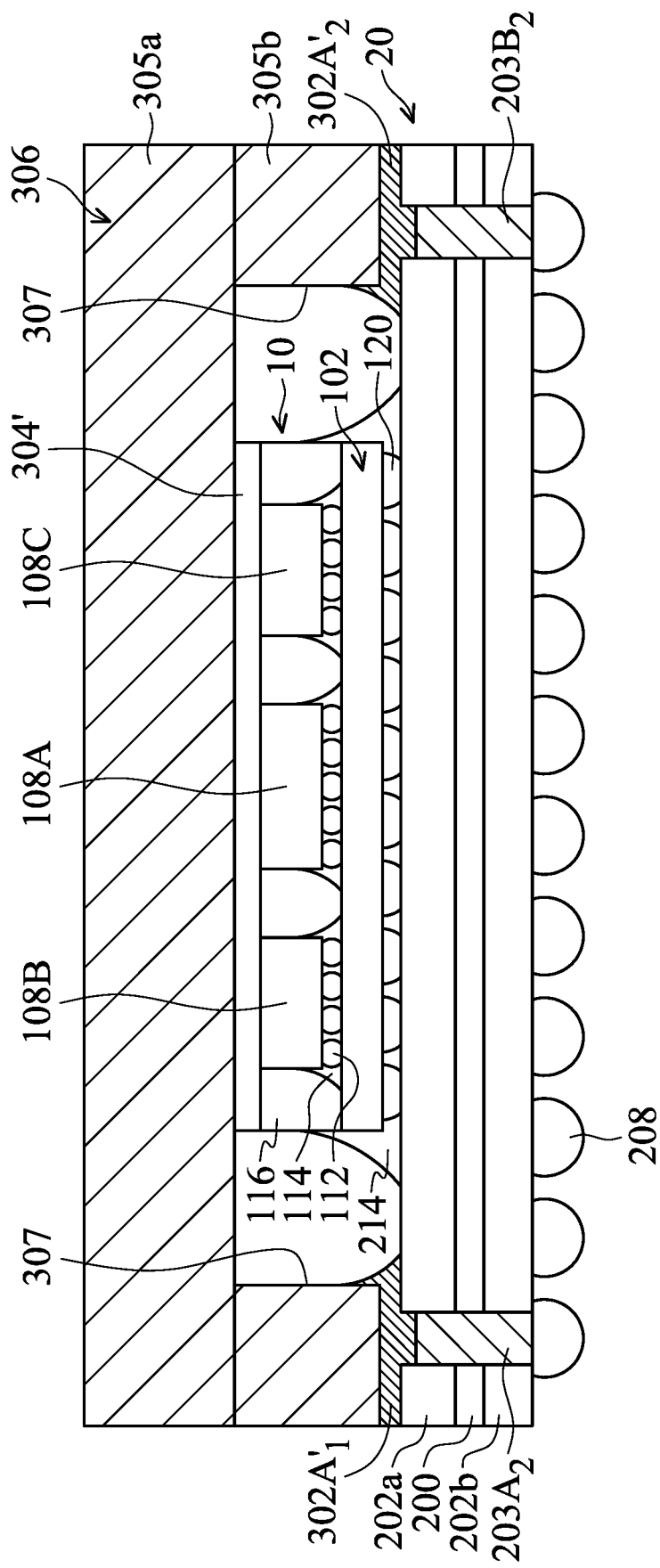
FIG. 10 is a cross-sectional view of a portion of a package structure, in accordance with some embodiments.

FIG. 10 is a cross-sectional view of a portion of a package structure, in accordance with some embodiments. In some embodiments, the first adhesive elements 302A'₁ and 302A'₂ extend beyond the inner sidewall of the support structure 305b. In some embodiments, the first adhesive elements 302A'₁ and 302A'₂ further extend upwards along the inner sidewall of the support structure 305b. In some embodiments, lower portions of the inner sidewall of the support structure 305b are covered by the first adhesive elements 302A'₁ and 302A'₂, as shown in FIG. 10. The portions of the first adhesive elements 302A'₁ and 302A'₂ that extend along the inner sidewall of the support structure 305b may help to enhance the adhesion between the protective lid 306 and the substrate 20 and the adhesion between the protective lid 306 and the ground structures 203A₂ and 203B₂.

Figure 11:
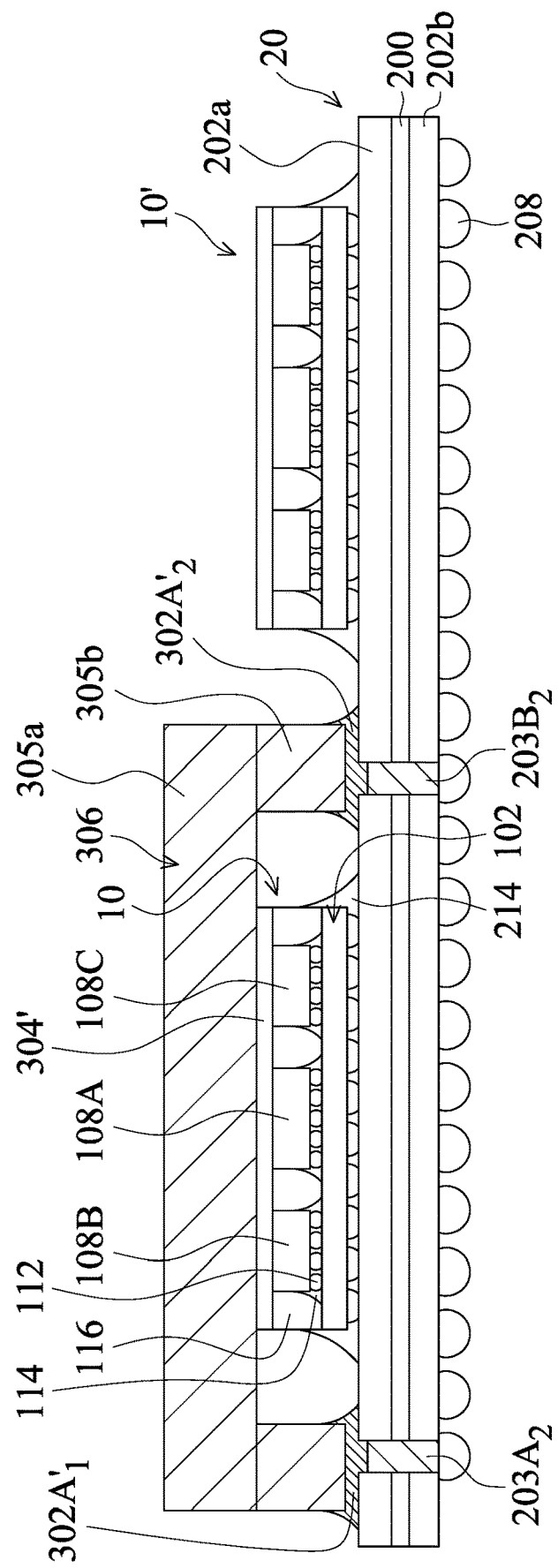
FIG. 11 is a cross-sectional view of a portion of a package structure, in accordance with some embodiments.

Many variations and/or modifications can be made to embodiments of the disclosure. FIG. 11 is a cross-sectional view of a portion of a package structure, in accordance with some embodiments. In some embodiments, a second die package (or chip-containing structure) 10' is disposed onto the substrate 20. In some embodiments, the protective lid 306 covers the die package 10 without covering the second die package 10'. Since the die package 10 is protective by the protective lid 306 that is electrically connected to the ground structures 203A₂ and 203B₂, electromagnetic interference (EMI) to and/or from the die package 10 is significantly reduced. The performance and reliability of the die package 10 and the second die package 10' are greatly improved.

In some other embodiments, other features and processes are also included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the disclosure form a package structure with a protective lid used for warpage-control, heat dissipation, and/or EMI protection. Two or more adhesive elements are used to bond the protective lid to the substrate that carries one or more chip structures. One of the adhesive elements is electrically conductive and is capable of forming electrical connection between the protective lid and a ground structure. Another adhesive element may help to reduce the risk of cracking of the package structure. Due to the hybrid adhesive elements, the EMI problems and the package reliability issues may be reduced or prevented at the same time. The performance and quality of the package structure are greatly improved.

In accordance with some embodiments, a method for forming a package structure. The method includes disposing a chip structure over a substrate, and forming a first adhesive element over the substrate. The first adhesive element has a first electrical resistivity. The method also includes forming a second adhesive element over the substrate. The second adhesive element has a second electrical resistivity, and the second electrical resistivity is greater than the first electrical resistivity. The method further includes attaching a protective lid to the substrate through the first adhesive element and the second adhesive element. The protective lid surrounds the chip structure and covers a top surface of the chip structure.

In accordance with some embodiments, a package structure is provided. The package structure includes a substrate and a chip structure over the substrate. The package structure also includes a protective lid attached to the substrate through a first adhesive element and a second adhesive element. The first adhesive element and the second adhesive element are made of different materials. The package structure further includes a ground structure electrically connected to the protective lid through the first adhesive element.

In accordance with some embodiments, a package structure is provided. The package structure includes a substrate and a die package over the substrate. The package structure also includes a protective lid attached to the substrate through a first adhesive element and a second adhesive element. The protective lid covers the die package. The first adhesive element has a first electrical resistivity, and the second adhesive element has a second electrical resistivity. The second electrical resistivity is greater than the first electrical resistivity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a substrate;
    a chip-containing structure over the substrate; and
    a protective lid attached to the substrate through a first adhesive element and a second adhesive element, wherein the first adhesive element has a first electrical resistivity, the second adhesive element has a second electrical resistivity, the second electrical resistivity is greater than the first electrical resistivity, the second adhesive element is closer to a corner edge of the substrate than the first adhesive element, and a portion of the second adhesive element is between the first adhesive element and the chip-containing structure.

2. The package structure as claimed in claim 1, wherein the first adhesive element is closer to a center of a side edge of the substrate than the second adhesive element.

3. The package structure as claimed in claim 1, further comprising:
    a ground structure electrically connected to the first adhesive element.

4. The package structure as claimed in claim 1, further comprising:
    a ground structure electrically connected to the protective lid through the first adhesive element.

5. The package structure as claimed in claim 4, further comprising:
    a second ground structure, wherein the first adhesive element covers the ground structure and the second ground structure.

6. The package structure as claimed in claim 1, wherein the first adhesive element is in direct contact with the second adhesive element.

7. The package structure as claimed in claim 1, further comprising:
    a third adhesive element between the protective lid and the substrate, wherein the third adhesive element has a lower electrical resistivity than the second electrical resistivity of the second adhesive element.

8. The package structure as claimed in claim 7, wherein the third adhesive element is laterally surrounded by the second adhesive element.

9. The package structure as claimed in claim 7, further comprising:
    a second ground structure, wherein the third adhesive element covers the second ground structure.

10. The package structure as claimed in claim 7, wherein the third adhesive element is separated from the first adhesive element by the second adhesive element.

11. A package structure, comprising:
    a substrate;
    a chip-containing structure over the substrate; and
    a protective lid attached to the substrate through a first adhesive element and a second adhesive element, wherein the first adhesive element and the second adhesive element are made of different materials, the second adhesive element is closer to a corner edge of the substrate than the first adhesive element, and the first adhesive element is closer to a center of a side edge of the substrate than the second adhesive element.

12. The package structure as claimed in claim 11, wherein a portion of the second adhesive element is between the first adhesive element and the chip-containing structure.

13. The package structure as claimed in claim 11, wherein the protective lid is electrically connected to the first adhesive element.

14. The package structure as claimed in claim 13, further comprising:
    a ground structure covered by the first adhesive element.

15. The package structure as claimed in claim 11, wherein the first adhesive element is in direct contact with the second adhesive element.

16. A package structure, comprising:
    a substrate;
    a chip-containing structure over the substrate; and a protective lid attached to the substrate through a first adhesive element and a second adhesive element, wherein the first adhesive element and the second adhesive element are made of different materials, the second adhesive element is closer to a corner edge of the substrate than the first adhesive element, and a portion of the second adhesive element is between the first adhesive element and the chip-containing structure.

17. The package structure as claimed in claim 16, further comprising:
a ground structure electrically connected to the protective lid through the first adhesive element.

18. The package structure as claimed in claim 17, further comprising:
a second ground structure electrically connected to the protective lid through the first adhesive element, wherein the first adhesive element covers tops of the ground structure and the second ground structure.

19. The package structure as claimed in claim 16, wherein the second adhesive element laterally surrounds the first adhesive element.

20. The package structure as claimed in claim 16, further comprising:
a third adhesive element between the protective lid and the substrate, wherein the third adhesive element is spaced apart from the first adhesive element, and the chip-containing structure is between the first adhesive element and the third adhesive element.

\* \* \* \* \*